(12) United States Patent
Nishimoto et al.

(10) Patent No.: US 6,583,467 B2
(45) Date of Patent: Jun. 24, 2003

(54) SEMICONDUCTOR INTEGRATED CIRCUIT DEVICE

(75) Inventors: Toshiaki Nishimoto, Higashimurayama (JP); Takashi Aoyagi, Hitachinaka (JP); Shogo Kiyota, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/179,217

(22) Filed: Jun. 26, 2002

(65) Prior Publication Data

US 2002/0173091 A1 Nov. 21, 2002

Related U.S. Application Data

(62) Division of application No. 09/677,758, filed on Oct. 3, 2000, now Pat. No. 6,444,514.

(30) Foreign Application Priority Data

Oct. 6, 1999 (JP) .............................. 11-285953

(51) Int. Cl.[7] .............................................. H01L 29/788
(52) U.S. Cl. ...................... 257/316; 257/314; 257/315
(58) Field of Search ................... 257/314, 315, 257/316

(56) References Cited

U.S. PATENT DOCUMENTS

| 5,793,078 | A |   | 8/1998 | Takeuchi |
|---|---|---|---|---|
| 5,972,783 | A | * | 10/1999 | Arai et al. .................. 438/513 |
| 6,103,574 | A |   | 8/2000 | Iwasaki |
| 6,201,277 | B1 |   | 3/2001 | Esquivel |
| 6,211,546 | B1 |   | 4/2001 | Kato et al. |
| 6,236,081 | B1 | * | 5/2001 | Fukumoto .................. 257/316 |
| 6,461,916 | B1 |   | 10/2002 | Adachi et al. |

FOREIGN PATENT DOCUMENTS

| JP | 7-273231 | 10/1995 |
|---|---|---|
| WO | 98/44567 | 8/1998 |

* cited by examiner

*Primary Examiner*—David Nelms
*Assistant Examiner*—Andy Huynh
(74) *Attorney, Agent, or Firm*—Mattingly, Stanger & Malur, P.C.

(57) ABSTRACT

In the semiconductor integrated circuit device, an AND-type flash memory is formed on a substrate in which stripe-like element separation regions 5 are formed and active regions L sandwiched between the element separation regions 5 are formed like stripes. A silicon monocrystal substrate containing nitrogen or carbon is used as the semiconductor substrate, to reduce dislocation defects and junction leakages so that the reliability and yield are improved.

12 Claims, 41 Drawing Sheets

READ/WRITE/ERASE VOLTAGE CONDITIONS

|  | WL1 READ | WL1 WRITE | WL1 ERASE |
|---|---|---|---|
| WL1 | 2/3/4V | 16/17/18V | −16 |
| WL2 | 0V | 4.5V | 0V |
| WL3 | 0V | 4.5V | 0V |
| ⋮ | ⋮ | ⋮ | ⋮ |
| WL128 | 0V | 4.5V | 0V |
| DL1 | 1V | 0V | 0V |
| DL2 | 1V | 6V | 0V |
| SL | 0V | 0V | 0V |
| SWMOS1 | Vcc | 10V | Vcc |
| SWMOS2 | Vcc | OPEN | Vcc |
| DPWL | 0V | 0V | 0V |

Fig. 36

| | |
|---|---|
| DL | Vcc |
| SL | 0 |
| WL1 | VGH |
| WL2 | 0 |
| WL3 | VGH |
| WL4 | VGH |
| WL5 | VGH |
| WL6 | VGH |
| WL7 | VGH |
| WL8 | VGH |

Fig.44

|  | READ | WRITE | BLOCK ERASE |
|---|---|---|---|
| DL1 | Vcc | 0 | open |
| DL2 | Vcc | Vdp | open |
| SL | 0 | 0 | open |
| PW | 0 | 0 | Ve |
| SW1 | VGH | Vp2 | Ve |
| WL1 | VGH | Vp2 | 0 |
| WL2 | 0 | Vp1 | 0 |
| WL3 | VGH | Vp2 | 0 |
| WL4 | VGH | Vp2 | 0 |
| ⋮ | ⋮ | ⋮ | ⋮ |
| WL16 | VGH | Vp2 | 0 |
| SW2 | VGH | 0 | Ve |

N=1Mbit (128 sectors)

1) OCCURRENCE OF HE DUE TO N+ WEAK LEAKAGE
(ERROR RATE UP AT LARGE Vd)
↓
2) LUCKY ELECTRON IS PARTIALLY INJECTED INTO FG
(ERROR RATE UP AT LARGE Vg)
↓
3) Vth INCREASE

US 6,583,467 B2

SEMICONDUCTOR INTEGRATED CIRCUIT DEVICE

This is a divisional application of U.S. Ser. No. 09/677,758 filed Oct. 3, 2000, now U.S. Pat. No. 6,444,514.

TECHNICAL FIELD OF THE INVENTION

The present invention relates to a semiconductor integrated circuit device and a method of manufacturing the same, and particularly, to a technique which can be advantageously applied to improvements of reliability of a non-volatile semiconductor memory device.

BACKGROUND OF THE INVENTION

Known as an electrically rewritable non-volatile semiconductor memory device is a so-called AND-type Flash memory described in the Japanese Patent Application Laid-Open Publication No. 07-273231. This publication describes the following manufacturing method as a technique for improving the integration of transistors called as memory cells in the chips.

That is, a three-layer film comprised of a gate oxide film, a first polycrystal silicon layer, and a silicon nitride film is coated on a semiconductor substrate made of monocrystal silicon. These layered films are patterned into stripe shapes. Next, n-type impurities are implanted into such a portion of the semiconductor substrate that is not covered by the patterned layer film, thereby to form column lines of an n-type impurity semiconductor region on the surface of the semiconductor substrate. Next, a CVD (Chemical Vapor Deposition) oxide film is coated thereon, and thereafter, a silicon oxide film formed by the CVD method is etched thereby to form a side wall spacer on the side wall portions of the first polycrystal silicon layer and the silicon nitride film. Next, using the first polycrystal silicon layer and the side wall spacer as a mask, grooves are formed on the semiconductor substrate by anisotropic dry etching. In this manner, the n-type impurity semiconductor region is separated, and column lines and source lines are each formed. Next, a silicon oxide film is formed on the surface of the grooves. Thereafter, the second polycrystal silicon layer is coated (deposited) on the entire surface of the semiconductor substrate, and the second polycrystal silicon layer is etched back by isotropic dry etching until the silicon nitride film is exposed. Next, the surface of the second polycrystal silicon layer which has been etched back is oxidized, thereby to form an element separation region made of polycrystal silicon covered with a silicon oxide film. Subsequently, the silicon nitride film is removed, and a third polycrystal silicon layer is coated. Patterning is carried out so as to protect the first polycrystal silicon layer. Floating gates parallel to the column lines are thus formed. Next, an interlayer insulating film and a fourth polycrystal silicon layer are coated, and patterning is carried out, thereby to form row lines which are made of the forth polycrystal silicon layer and are vertical to the column lines. In this manner, the first and third polycrystal silicon layers are separated from each other, and floating gates are formed.

In the AND-type flash memory formed in this kind of method, the semiconductor device is constructed to have a non-volatile memory function by storing electrons in the floating gates. In particular, n-type impurity semiconductor regions formed in both sides of the first polycrystal silicon layer serve as source or drain regions. In this method, processing on the first polycrystal silicon layer and formation of the element separation region are achieved by a mask pattern of one single layer. Therefore, no matching margin is necessary between the gates and the element separation region, so the cell area is reduced to be small.

As a method for much higher integration of an AND-type flash memory, for example, the PCT International Publication No. WO98/44567 describes a technique in which a shallow-groove-type element separation region is formed on the main surface of a semiconductor substrate and a memory cell is formed in an active region surrounded by the element separation region. In the technique according to this publication, the element separation region is formed like a stripe, so that the active region is formed also like a stripe. The lower electrode of a floating gate is formed also like a stripe, layered on a center portion of the active region. With this lower electrode used as a mask, an ion implantation method is applied so that source lines and data lines are formed by self-alignment in the active region. Thereafter, an insulating film is filled between the lower electrodes. Upper electrodes of floating gates are formed as an upper layer thereof. In this manner, the area of the upper electrode is enlarged so that coupling with a control gate (word line) is enhanced and down-sizing is realized simultaneously.

SUMMARY OF THE INVENTION

However, the present inventors have found the following problems in the technique for forming a stripe-like element separation region as described above.

That is, many leakages have been found to occur between the sources and drains of memory elements (i.e., between source lines and data lines) in case where stripe-like element separation regions are formed and an active region is formed to be inserted between element separation regions. Therefore, this is a large obstacle which hinders securing of the reliability and the yield of the semiconductor integrated circuit device.

According to the experiments and discussions made by the present inventors, it has been found that a defective leakage is one of factors that cause an element junction leakage. FIG. 54(a) is a TEM photograph when an active region (channel portion) of a portion which causes a defect is observed. FIG. 54(b) is a schematic view in which FIG. 54(a) is traced. An active region ACL is formed between element separation regions SGI, and a floating gate electrode FG is formed on the active region ACL with a tunnel oxide film FNO inserted therebetween. On the floating gate electrode FG, a control gate electrode CG is formed with an inter-layer insulating film INS inserted therebetween. The control gate electrode CG is constructed in a two-layer structure comprised of a polycrystal silicon film and a tungsten silicide film. As shown in FIG. 54(b), a crystal defect D is formed on the active region ACL. It is considered that a leakage current is caused due to this kind of crystal defect.

Even if existence of a crystal defect does not directly involve an element defect, it is considered that it may become a factor which deteriorates the reliability. FIG. 55(a) is a circuit diagram which explains a read sequence, and FIG. 55(b) is a graph showing discharge-time-dependence of the number of defective sectors that cause a read error. As shown in FIG. 55(a), a read sequence from memory cells turns on a STD and turns off a STS, thereby to charge (precharge) electric charges from a global data line to a local data line. Next, the STS is turned on and the local source line is connected to a common source line, thereby to discharge the remaining electric charges from the local source line. Thereafter, the SDT is turned off to start sensing. In the sensing, a necessary voltage is applied to word lines (control gates), and each memory cell transistor is turned on or off in correspondence with the charge amount stored in its floating gate. If it is turned on, the electric potential of the local data line is lowered. This potential can be detected by a sense amplifier, so information in the memory cell can be extracted. At this time, if the electric potential of the local source line is not at a sufficiently low value, the following situation appears. Remaining electric charges exist in the local source line and therefore, the electric potential is not lowered, although the memory cell transistor is turned on and the potential of the local data line is lowered. That is, a read error is caused. Therefore, it is necessary to spend a sufficient time discharging electric charges from the local source line prior to the sensing. However, as shown in FIG. 55(b), there has been an experimental result showing that the number of defective sectors increases if the discharge time is elongated. Occurrence of defective sectors in accordance with increase of the discharge time is considered as being caused due to leakage currents between the source and drains (source lines and data lines) or due to leakage currents between the substrates during the discharging. The present inventors have confirmed that it is also related to a crystal defect as describe previously. Consequently, in the present situation, a discharge time of 1.6 $\mu$s is required, and 500 defective sectors or so occur as can be seen from the graph. This situation is not satisfactory from the viewpoint of reliability. Particularly in case of a multi-value memory, there are demands for a high sensing accuracy and a much elongated discharge time.

As another factor which causes deterioration of the reliability, there is a problem which occurs in write-disabled cells during the writing operation. FIG. 56(a) is a graph which normally plots the shifts of a threshold voltage caused by drain disturbance. FIG. 56(b) is a circuit diagram which explains the drain disturbance. FIG. 56(c) is a cross-sectional conceptual view showing memory cell portions. For example, during the operation of writing into a memory cell M11, 18 V is applied to a control gate WL1 and 4.5 V is applied to control gates WL2 to WLn. To perform writing into the cell M11, the data line DL1 is set to 0 V so that a sufficient voltage is applied between the drain (data line) and the control gate of the cell M11, while 6 V is applied to a data line DL2 to inhibit writing into the memory cell M21. At this time, the source line S is open. Taken into consideration the memory cells M22 to M2n, their drains (data line) are applied with 6 V although their sources are open. Therefore, if a leakage current occurs between junctions of the memory cells, hot electrons are generated. A part of the hot electrons passes through the tunnel oxide film and reaches the floating gates. This part of hot electrons is very small so that problems are not particularly caused in a short time period. However, this will cause a problem in consideration of the severest conditions. Suppose, for example, a case that data is always written into memory cells M11 to M1n−1 but is not written into the memory cell M1n at all. Even in this case, the information held in the memory cell M2n must be maintained till the end of the lifetime of the product. Where rewriting up to 105 times is guaranteed by the product and the voltage application time is 1 ms, the memory cell M2n encounters the situation as described above for a total time of $10^5 \times 1$ ms$\times 127$=12700 s since 128 memory cells on one local data line are connected (n=128). That is, in case of the severest condition, it is demanded that Vth should not be shifted even if the memory cell is exposed to the situation described above. However, as shown in FIG. 56(a), 0.1% of the sectors reach 2.1 V or more as a demanded specification in about 1000 s. This result is not sufficient for ensuring high reliability.

An object of the present invention is to reduce crystal defects inside a non-volatile memory in which stripe-like element separation regions are formed to attain higher integration.

Another object of the present invention is to reduce junction leakages in a non-volatile memory in which stripe-like element separation regions are formed to attain higher integration.

Also, another object of the present invention is to improve the reliability and yield of a non-volatile memory in which stripe-like element separation regions are formed to attain higher integration.

The above-described and other objects of the present invention as well as the noble features of the present invention will be clearly understood from the description of the present specification and the appended drawings.

Of the inventions disclosed in the present application, representative one will be explained in brief below.

A semiconductor integrated circuit device comprises: a semiconductor substrate made of silicon monocrystal; stripe-like element separation regions formed on a main surface of the semiconductor substrate; and a plurality of MISFETs (Metal Insulator Semiconductor Field Effect Transistors) or MIS-type memory elements formed in an active region between the element separation regions, the MISFETs or MIS-type memory elements being connected in series or parallel with each other, wherein a light element having a smaller mass number than silicon is introduced into the semiconductor substrate.

In this semiconductor integrated circuit device, a light element is introduced into the semiconductor substrate. Oxygen is attracted to the vicinity of the light element, and micro defects are formed, so that occurrence of dislocation defects can be reduced. According to experiments made by the present inventors, defects caused by leakages could be reduced by using a substrate to which a light element introduced, in place of a substrate which is conventionally used. That is, a conventional device uses a silicon monocrystal substrate which contains a large amount of oxygen. In this device, oxygen is drawn by a reduction atmosphere used when epitaxial growth is carried out on the surface of the silicon substrate. Therefore, the function of restricting dislocation defects does not work sufficiently. In the present invention, a light element such as nitrogen or carbon is introduced into the substrate, in place of oxygen, and is used to form memory elements having stripe-like element separation regions. Thus, an expected characteristic is attained.

The semiconductor substrate described above is advantageous for a substrate including an epitaxial layer on a base substrate to which a light element is introduced. The epitaxial growth layer has a film thickness within a range of 1 to 5 $\mu$m. The base substrate is formed by a CZ (Czochralski) method.

The light element is nitrogen or carbon. Or, boron may be used. Nitrogen is introduced at a concentration of $1\times10^{13}$ to $1\times10^{17}$ atomics/cm$^3$ and oxygen is introduced at a concentration of $6\times10^{17}$ to $9\times10^{17}$ atomics/cm$^3$ into the semiconductor substrate or the base substrate. Or, carbon is introduced at a concentration of $1\times10^{16}$ to $1\times10^{17}$ atomics/cm$^3$ and oxygen is introduced at a concentration of $6\times10^{17}$ to $9\times10^{17}$ atomics/cm$^3$, into the semiconductor substrate or the base substrate.

A silicon oxide film is embedded in a shallow groove and a surface of the silicon oxide film is flattened.

Also, the stripe-like element separation regions are formed in parallel with a direction (cleavage direction) or direction equivalent thereto in which the semiconductor substrate tends to cleave most easily according to crystallography, or a direction vertical to the cleavage direction or equivalent thereto. If the main surface of the semiconductor substrate is a (100) surface or a surface equivalent thereto, stripe-like patterns of the element separation regions are formed in parallel with a direction [011] of silicon crystal or a direction equivalent thereto, or a direction [011] or a direction equivalent thereto. By forming elements in this direction, the wafer area can be used effectively and the costs can be reduced. [011] means 1 bar or bar 1.

The semiconductor substrate is cut by scribing it in the cleavage direction or the direction equivalent thereto and in the direction vertical to the cleavage direction or the direction equivalent thereto. If the main surface of the semiconductor substrate is a (100) surface or a surface equivalent thereto, the semiconductor substrate is cut by scribing it in the direction [011] of silicon crystal or the direction equivalent thereto and in the direction [011] or the direction equivalent thereto.

The size of each of the active regions in a direction parallel to stripe-like patterns of the active regions is 100 or more times longer than a size thereof in a direction vertical to the stripe-like patterns.

The MIS-type memory elements are AND-type or NAND-type non-volatile memory elements.

The semiconductor substrate or the base substrate has a crystal defect density of $3 \times 10^9$ cm$^{-3}$ or more according to a bulk micro defect measurement. According to discussions made by the present inventors, it is possible to prevent dislocation defects and to obtain a non-volatile memory element with a sufficiently high reliability if a defect density of $3 \times 10^9$ cm$^{-3}$ is found by a BMD measurement.

A method of manufacturing a semiconductor integrated circuit device, according to the present invention, comprises: a step (a) of forming a pattern having a stripe-like opening on a main surface of a semiconductor substrate and of etching the semiconductor substrate with the pattern used as a mask, thereby to form a stripe-like groove on the main surface of the semiconductor substrate; a step (b) of depositing an insulating film for filling internally the groove; a step (c) of etching or polishing the insulating film such that the insulating film remains in the groove, thereby to form an element separation region; a step (d) of depositing a polycrystal silicon film on the main surface of the semiconductor substrate, and of patterning the polycrystal silicon film into a stripe-like shape in a direction parallel to the element separation region formed like a stripe; and a step (e) of ion-implanting impurities into an active region surrounded by the element separation region, using the polycrystal silicon film formed in the stripe-like shape as a mask, thereby to form a semiconductor region which functions as a source/drain region and a wire of a MIS-type element, wherein a monocrystal silicon substrate into which a light element having a smaller mass number than silicon is introduced is used as the semiconductor substrate.

Another method of manufacturing a semiconductor integrated circuit device, according to the present invention, comprises: a step (a) of forming a pattern having a stripe-like opening on a main surface of a semiconductor substrate and of etching the semiconductor substrate with the pattern used as a mask, thereby to form a stripe-like groove on the main surface of the semiconductor substrate; a step (b) of depositing an insulating film for filling internally the groove; a step (c) of etching or polishing the insulating film such that the insulating film remains in the groove, thereby to form an element separation region; a step (d) of depositing a polycrystal silicon film on the main surface of the semiconductor substrate, and of patterning the polycrystal silicon film into a stripe-like shape in a direction vertical to the element separation region formed like a stripe; and a step (e) of ion-implanting impurities into an active region surrounded by the element separation region, using the polycrystal silicon film formed in the stripe-like shape as a mask, thereby to form a semiconductor region which functions as a source/drain region which is shared in common between adjacent MIS-type elements, wherein a monocrystal silicon substrate into which a light element having a smaller mass number than silicon is introduced is used as the semiconductor substrate.

According to the methods for manufacturing a semiconductor integrated circuit device, as described above, it is possible to form a memory element in which reduce dislocation defects of crystal are reduced and junction leakages are restricted.

A substrate in which a silicon layer is grown within a range of 1 to 5 μm by epitaxial growth on a silicon monocrystal substrate to which a light element having a smaller mass number than silicon is introduced is used as the semiconductor substrate.

The light element is nitrogen or carbon. Or, boron may be used. The concentration of the nitrogen ranges from $1 \times 10^{13}$ to $1 \times 10^{15}$ atomics/cm$^3$ and the concentration of the carbon ranges from $1 \times 10^{16}$ to $1 \times 10^{17}$ atomics/cm$^3$.

The pattern like a stripe is formed in a direction (cleavage direction) in which the semiconductor substrate tends to cleave most easily according to crystallography or in a direction equivalent thereto, or a direction vertical to the cleavage direction or a direction equivalent thereto. Or, if the main surface of the semiconductor substrate is a (100) surface or a surface equivalent thereto, the pattern like a stripe is formed in parallel with a direction equivalent to a direction [011] of silicon crystal or a direction equivalent to a direction [011] of silicon crystal.

The active region formed like a stripe has a longer edge which is 100 or more times longer than a shorter edge.

The methods described above further comprise a step of scribing the semiconductor substrate in a direction (cleavage direction) in which the semiconductor substrate tends to cleave most easily according to crystallography or a direction equivalent thereto and in a direction vertical or equivalent to the cleavage direction and thereby cutting the semiconductor substrate into silicon chips. Or, a step of scribing the semiconductor substrate in a direction [011] of silicon crystal or a direction equivalent thereto and in a direction [011] or a direction equivalent thereto and thereby cutting the semiconductor substrate into silicon chips is comprised if the semiconductor substrate has a (100) surface or an equivalent surface as the main surface. If scribing is made in the direction in which crystal easily cleaves, dislocation defects are reduced so that a non-volatile memory element can be formed with sufficiently high reliability.

BRIEF DESCRIPTIONS OF THE DRAWINGS

FIG. 36 is a table showing read voltage conditions of the NAND-type mask ROM according to the embodiment 2.

FIG. 44 is a table showing voltage conditions for reading, writing, and erasure of the NAND-type flash memory according to the embodiment 3.

DESCRIPTION OF THE PREFERRED EMBODIMENTS

In the following, embodiments of the present invention will be explained in details with reference to the drawings. In all figures explaining the embodiments, those components that have an equal function will be denoted at an equal reference symbol, and reiterative explanation of those components will be omitted herefrom.

(Embodiment 1)

Figure 1:
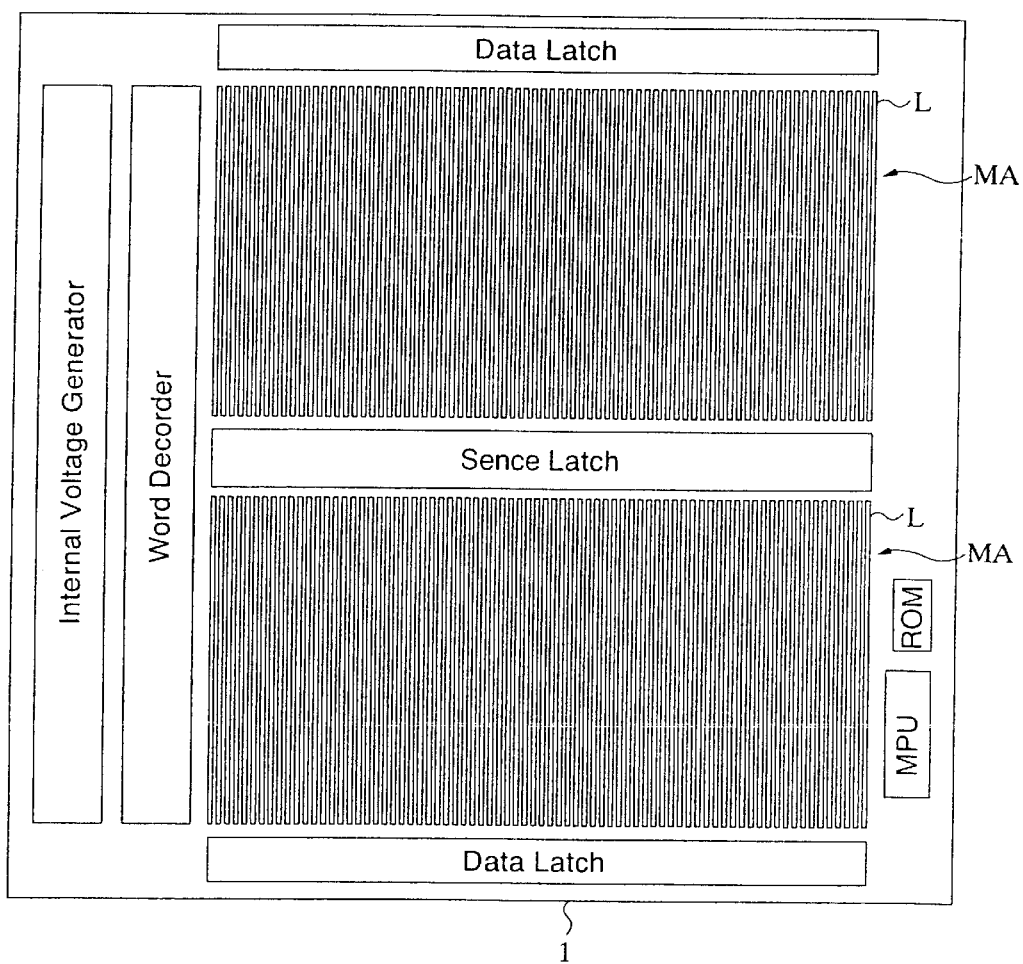
FIG. 1 is a plan view of a chip showing an example of an AND-type flash memory as an embodiment of the present invention.

FIG. 1 is a plan view showing an example of an AND-type flash memory according to an embodiment of the present invention. The chip 1 has memory cell arrays MA. Provided in the periphery of the arrays are a sense latch circuit, data latch circuits, a word detector circuit, an internal voltage generator circuit, a main processing unit MPU, and a read-only memory ROM. Within the memory cell arrays MA, stripe-like active regions L are formed.

Figure 2:
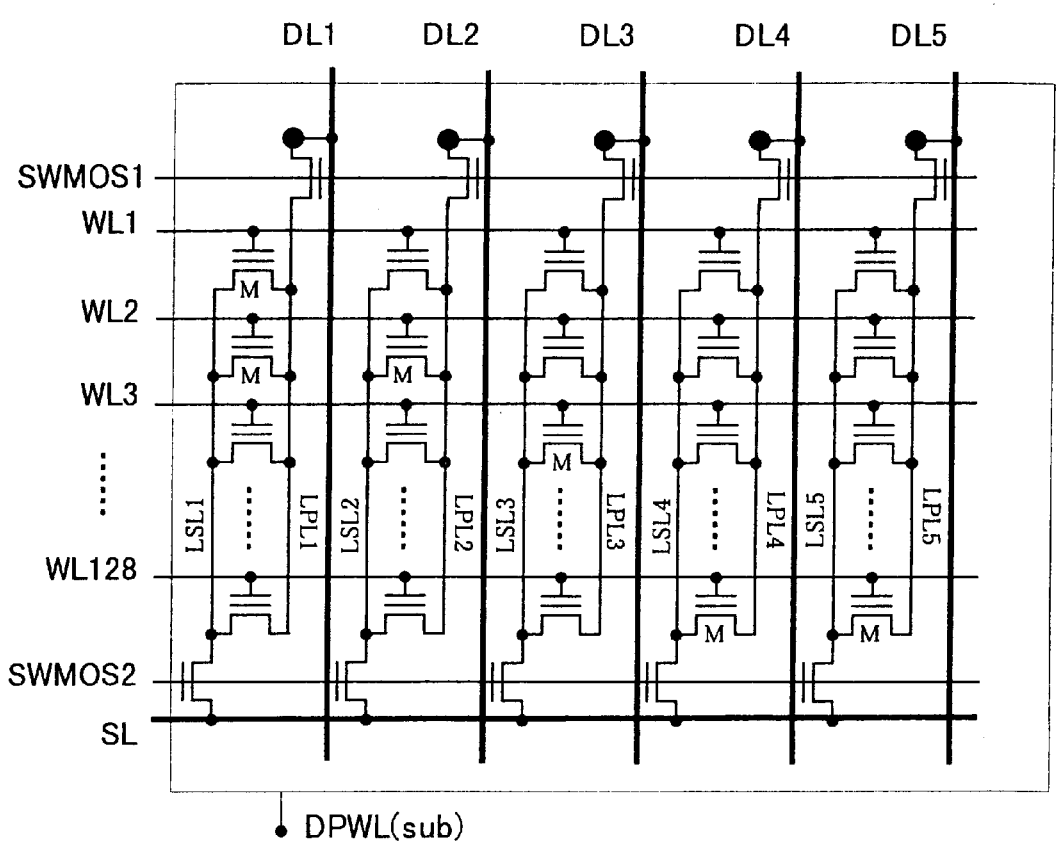
FIG. 2 is a circuit diagram showing memory cell regions of the AND-type flash memory according to the embodiment 1.

FIG. 2 is a circuit diagram showing a memory cell region of the AND-type flash memory according to the present embodiment. Memory cells M and switch transistors SWMOSes are constructed by MOSFETs (Metal Oxide Semiconductor Field Effect Transistors). The memory cells M are arranged in 128 columns in the direction of data lines DL and in rows equivalent to 2 k byte (one. sector) in the direction of word lines WL. The respective memory cells M are connected in parallel in the data line DL direction, and drain and source regions thereof are determined by a local data line LDL and a local source line LSL. Each local data line LDL is connected to a global data line DL through a switch transistor SWMOS1, and each local source line LSL is connected to a global source line SL through a switch transistor SWMOS2. Each word line WL is connected with control electrodes of memory cells M.

Figure 3:
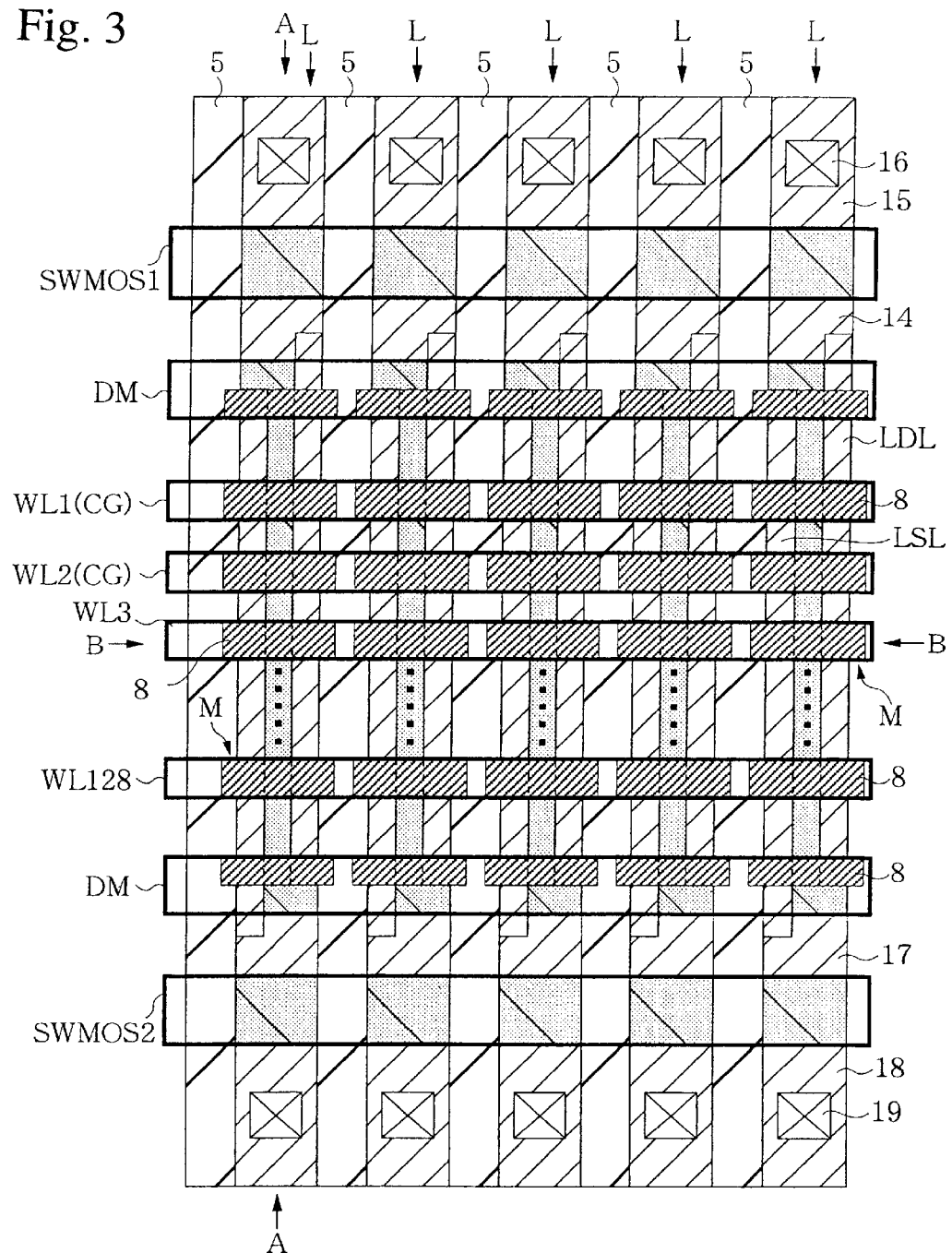
FIG. 3 is a plan view showing a part of a structure of memory cells and selection transistors in the AND-type flash memory according to the embodiment 1.
Figure 4:
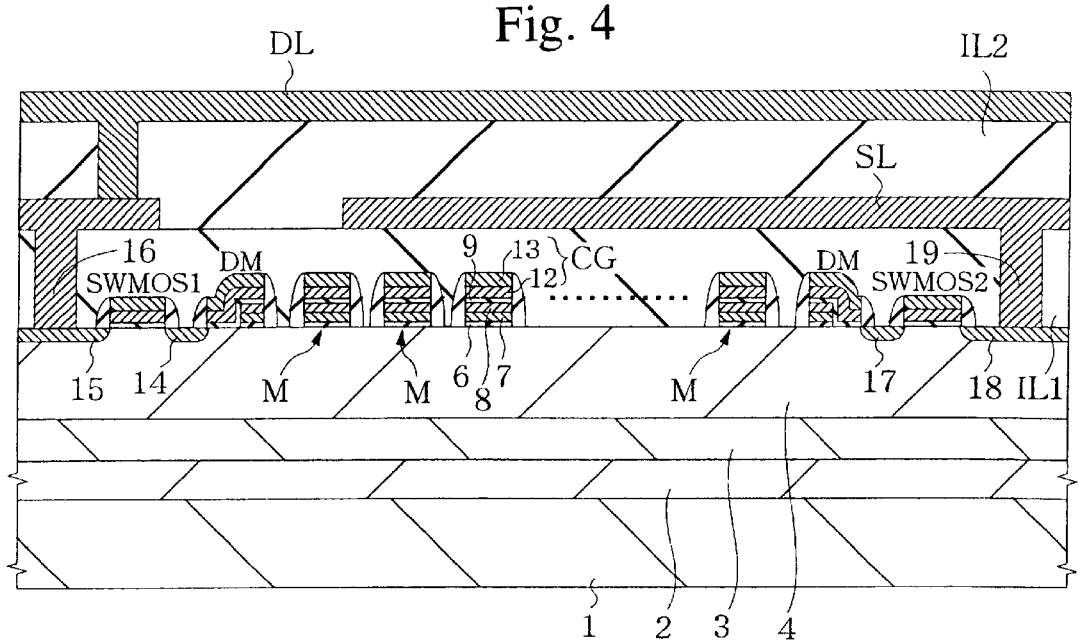
FIG. 4 is a cross-sectional view cut along the line A—A in FIG. 3.
Figure 5:
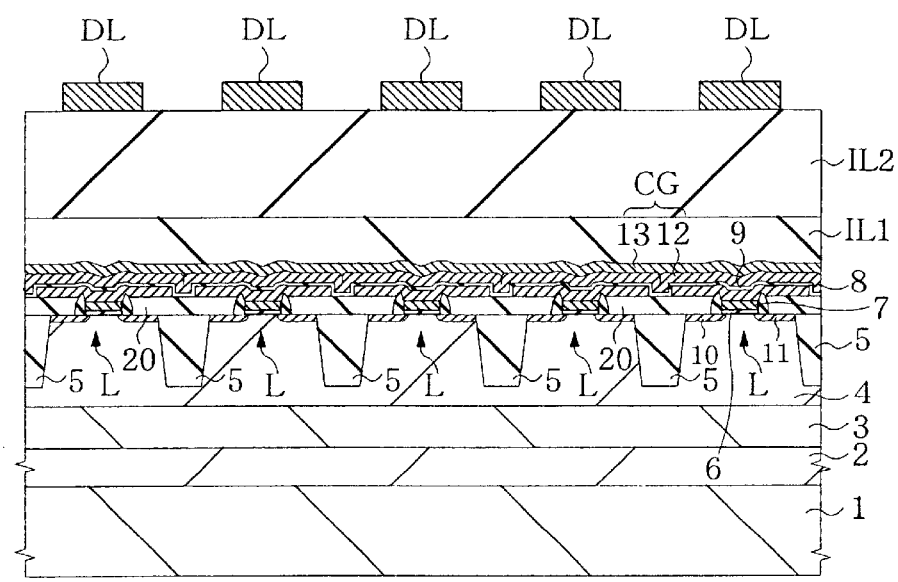
FIG. 5 is a cross-sectional view cut along the line B—B in FIG. 3.

FIG. 3 is a plan view partially showing memory cells and selection transistors. FIG. 4 is a cross-sectional view along the line A—A in FIG. 3. FIG. 5 is a cross-sectional view along the line B—B in FIG. 3.

Near the main surface of the semiconductor substrate 1, a p-type epitaxial layer 2 is formed. Further, an n-type well 3 is formed in the epitaxial layer 2, and a p-type well 4 is formed in the main surface. The n-type well 3 has a function to insulate the p-type well 4, and potentials can be applied to individual p-type wells 4. The film thickness of the epitaxial layer 2 is within a range of 1 to 5 $\mu$m, e.g., 3 $\mu$m.

The semiconductor substrate 1 uses a wafer which is made of silicon monocrystal by means of a CZ method. Also, nitrogen is introduced at a concentration of $1\times10^{13}$ to $1\times10^{15}$ atomics/cm$^3$ into the semiconductor substrate 1. By thus introducing nitrogen, it is possible to reduce dislocation defects caused in the direction in which silicon easily cleaves due to micro defects caused in the semiconductor substrate 1.

That is, if nitrogen exists within the semiconductor substrate 1, oxygen is attracted to the part (impurity side) of the nitrogen. The nitrogen and the attracted oxygen act to generate a micro defect which will not influence the electric characteristic. If a dislocation defect grows and reaches the micro defect part, the dislocation is interrupted there so the dislocation does not grow any more. Therefore, if a lot of micro defects exist, dislocation defects are reduced so as to contribute to improvements of the yield.

As will be explained later, in the present embodiment, stripe-like grooves are formed and a silicon oxide film is embedded in these grooves, thereby to form element separation regions. Therefore, active regions are formed also in stripe-like shapes, and dislocations tend to cause in the direction of the stripe-like pattern. Taken into consideration that the wafer is scribed later, scribing should preferably be performed in the direction silicon easily cleaves, which is the direction [011] or [011], in case of using the (100) surface as a main surface. Once a scribe line is decide, it is preferable that the narrow long pattern is parallel to the scribe line (chip end surface) as much as possible, in order to use effectively the area of the wafer (chip). Therefore, the pattern of the narrow long active regions according to the present invention is compelled to have longer edges extended in the direction along the cleaving direction. Therefore, dislocation defects grow in the direction along the longer edges. In addition, the memory cells according to the present embodiment are formed on the active regions, so that influences from the dislocation defects become particularly severe.

However, since nitrogen is introduced into the semiconductor substrate 1, dislocation defects can be reduced and occurrence of dislocations can be prevented, even if such a stress is effected. Therefore, defects such as junction leakages caused by dislocation defects can be prevented. In addition, drain disturbances caused by junction leakages can be prevented. Further, defects caused by dislocations can be reduced, so the source discharge time required for reading can be elongated and the reading accuracy is improved. Particularly in case of multi-value recording which will be described later, the present invention can be applied more advantageously since improvements of the reading accuracy are required.

If nitrogen is introduced to the extent described above, the content of oxygen is $6\times10^{17}$ to $9\times10^{17}$ atomics/cm$^3$ or so. After introducing nitrogen to this extent and carrying out a heat treatment at 700° C. for 4 hours and at 1000° C. for 16 hours, scanning in the z-direction (depth direction) was carried out by Oxygen Precipitate Profiler (manufactured by HYT) to evaluate bulk micro defects. Then, a defect density of $3 \times 10^9$ cm$^{-3}$ or more was found. The heat treatment is equivalent to a heat load which is received totally through the steps of the present embodiment. If a higher defect density than the above value is found, advantages of the present invention can be attained sufficiently.

Although the above example shows a case of introducing nitrogen into the semiconductor substrate 1, carbon may be introduced. Carbon may be introduced at a concentration of $1 \times 10^{16}$ to $1 \times 10^{17}$ atomics/cm$^3$. In this case, oxygen is contained at a concentration of $6 \times 10^{17}$ to $9 \times 10^{17}$ atomics/cm$^3$. Also, the element that can be introduced to the semiconductor substrate 1 is not limited to nitrogen or carbon, any element that has a smaller mass number than that of silicon may be introduced. For example, boron may be introduced.

Near the main surface of the p-type well 4, element separation regions 5 are formed. The element separation regions 5 are formed by embedding a silicon oxide film in shallow grooves. The element separation regions 5 are formed like stripes as shown in the plan view. Therefore, active regions L defined by the element separation regions 5 are also formed like stripes.

Memory cells M, dummy gates DM, and switch transistors SWMOS are formed on the main surface of the semiconductor substrate 1 (p-type well 4).

Each memory cell M includes a lower floating gate 7 formed on the center portion of an active region L with a tunnel oxide film 6 inserted therebetween, an upper floating gate 8, an interlayer insulating film 9 on an upper floating gate 8, a control gate CG on the interlayer insulating film 9, a source region 10, and a drain region 11. The source region 10 and drain region 11 are formed in both sides of the lower floating gate 7. The control gate CG has a two-layer structure comprising a polycrystal silicon film 12 and a tungsten silicide film 13. The lower floating gate 7 and the upper floating gate 8 are made of polycrystal silicon films. The interlayer insulating film 9 is constructed by a layered film comprised of a silicon oxide film and a silicon nitride film.

The control gates CG are formed so as to be extending in a direction vertical to the stripe-like pattern of the active regions L, and function as word lines WL. Each control gate CG is formed to be common to the control gate between memory cells adjacent to the gate in the extending direction of the control gates CG, and connected to each other.

The source regions 10 are connected to each other between the memory cells adjacent to each other in the direction of the stripe-like pattern of the active regions L. The drain regions 11 are connected in the same manner as above. The source regions 10 form local source lines LSL, and the drain regions 11 form local data lines LDL. The local data lines LDL are connected to a source/drain region 14 of the switch transistor SWMOS1. Another source/drain region 15 of the switch transistor SWMOS1 is connected to the global data lines DL through contact holes 16. The local source lines LSL are connected to a source/drain region 17 of the switch transistor SWMOS2. Another source/drain region 18 of the switch transistor SWMOS2 is connected to global source lines SL through contact holes 19.

An insulating film 20 is formed between each pair of adjacent lower floating gates 7. The floating gates 8 are formed partially on the insulating films 20. In this manner, the area of the floating gates 8 can be increased thereby improving their coupling with the control gates CG.

Dummy gates DM are formed as absorbers between the memory cells M and the switch transistors SWMOS, and do not particularly operate. The gate insulating films of the switch transistors SWMOS are formed at the same time when the interlayer insulating film 9 is formed. The gate electrodes of the switch transistors SWMOS are made of coating films formed in the same step as the step of forming the control gates CG.

The memory cells M, dummy gates DM, and switch transistors SWMOS are covered with an insulating film IL1, and the global source lines SL are formed as first-layer wires on the insulating film IL1. An insulating film IL2 is further formed, and the global data lines DL are formed as a second-layer wire on the insulating film IL2.

Figures 6, 7:
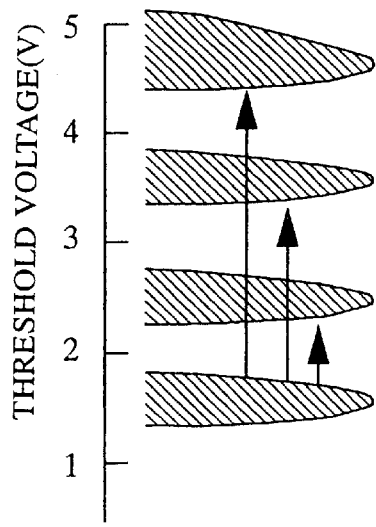
FIG. 6 is a table showing operating voltages of the AND-type flash memory according to the embodiment 1.
FIG. 7 is a graph showing multi-value recording of the AND-type flash memory according to the embodiment 1.

Operation of the AND-type flash memory will be explained next. FIG. 6 is a table showing voltages during operation. FIG. 6 shows voltages applied to the word line WL1 in case where batch-reading, batch-writing, and batch-erasure are made on one sector.

For reading, WL2 to WL128 are all set to 0 V, and all the global lines DL are applied with 1 V. The global source lines SL and the DPWL are set to 0 V. To apply a voltage to the local data lines and local source lines, the SWMOS1 and SWMOS2 are applied with a voltage Vcc and are turned on. In this state, voltages of 2 V, 3 V, and 4 V are sequentially applied to the word line WL1, and potential changes of the data lines are detected. Three different voltages are thus applied to the word line WL1 in order to read four recorded states (2-bit) from one memory cell with utilizing of shifting of the threshold voltage in accordance with the change amount stored in the floating gate as shown in FIG. 7. Three kinds of voltages are applied to the WL1 and the threshold value is detected. Information for 2 bits can be detected depending on what level the threshold value is.

For writing, the word lines WL2 to WL128 are set to 4.5 V, and the data line DL1 of the memory cell (M11) which is selected for writing is applied with 0 V. In order to inhibit writing into non-selected memory cells in the same sector, the other data lines (DL2 to DLm) are applied with 6 V. The source lines SL and DPWL are set to 0 V. To apply a voltage to the local data lines, the switch transistor SWMOS1 is applied with a high voltage of 10 V. In order that the local source lines are open, the switch transistor SWMOS2 is set to 0 V (off). In this state, the word line WL1 is applied with 16 V, 17 V, or 18 V, and potential changes of the data lines are detected. Any one of potentials 16 V, 17 V, and 18 V is selected depending on the contents of data to be written. In this manner, the charge amount injected into the floating gate is controlled as shown in FIG. 7, and multi-value recording is realized.

For erasure, all the potentials are set to 0 V, except for the potential of the word line WL1 as an erasure-target sector. The word line WL 1 is applied with −16 V. In this manner, electrons are drawn from the floating gates of all the memory cells connected to the WL1, so data is erased. Note that each of the switch transistors SWMOS1 and SWMOS2 is applied with the Vcc and is turned on, in order to supply the local data lines and local source lines with a potential of 0 V.

Next, a method of manufacturing the AND-type flash memory will be explained with reference to FIGS. 8 to 32. FIGS. 8 to 31 are cross-sectional views and plan views showing the method of manufacturing the AND-type flash memory according to the embodiment 1, in the order of its steps.

Figure 8:
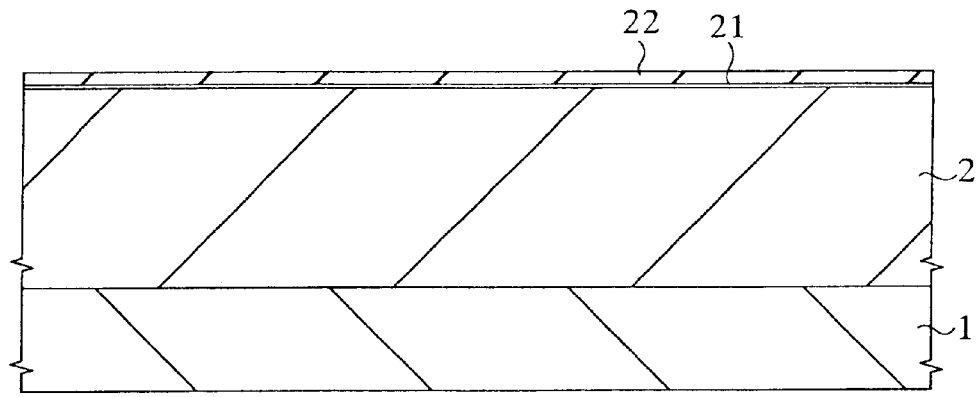
FIG. 8 is a cross-sectional view showing the method of manufacturing the AND-type flash memory according to the embodiment 1 in the order of its steps.

As shown in FIG. 8, a semiconductor substrate 1 having an epitaxial layer 2 on the surface of the substrate is prepared. A silicon oxide film 21 and a silicon nitride film 22 are formed on the surface of the epitaxial layer 2. The film thickness of the silicon oxide film 21 is set to 10 nm, and the film thickness of the silicon nitride film 22 is set to 12 nm. The silicon oxide film 21 is a sacrifice oxide film formed to relax the film stress of the silicon nitride film 22. The silicon nitride film 22 is used as a mask for forming grooves.

The present embodiment uses a silicon monocrystal substrate as the semiconductor substrate 1, to which nitrogen is introduced. Since the present embodiment uses a CZ substrate, oxygen is contained at 6 to $9\times10^{17}$ atomics/cm$^3$ or so in the substrate. It is unnecessary to introduce oxygen at a much higher concentration. That is, oxygen is drawn in a reduction atmosphere for forming the epitaxial layer 2. This drawing of oxygen is not preferred in case where oxygen is expected as a site for generating a micro defect because occurrence of micro defects is reduced. However, since nitrogen is introduced in the present embodiment, oxygen is precipitated around introduced nitrogen at the same time when the epitaxial layer 2 is formed in the epitaxial step which also is a heat treatment step. That is, oxygen is gradually trapped near introduced nitrogen, and micro defects are thereby formed. Accordingly, it is unnecessary to use a substrate to which oxygen is introduced at a high concentration, as the semiconductor substrate 1. It is possible to avoid a problem that even necessary impurities are eliminated due to formation of the epitaxial layer 2. The amount of nitrogen required in this stage should preferably fall in the range of $1\times10^{13}$ to $1\times10^{15}$ atomics/cm$^3$.

Since elimination of oxygen in accordance with epitaxial growth does not cause a problem any more, the epitaxial layer 2 can be formed to be thick. The film thickness of the epitaxial layer 2 is set to 1 to 5 μm.

Note that carbon may be introduced in place of nitrogen. The concentration of carbon should preferably fall in a range of $1\times10^{16}$ to $1\times10^{17}$ atomics/cm$^3$.

Figure 9:
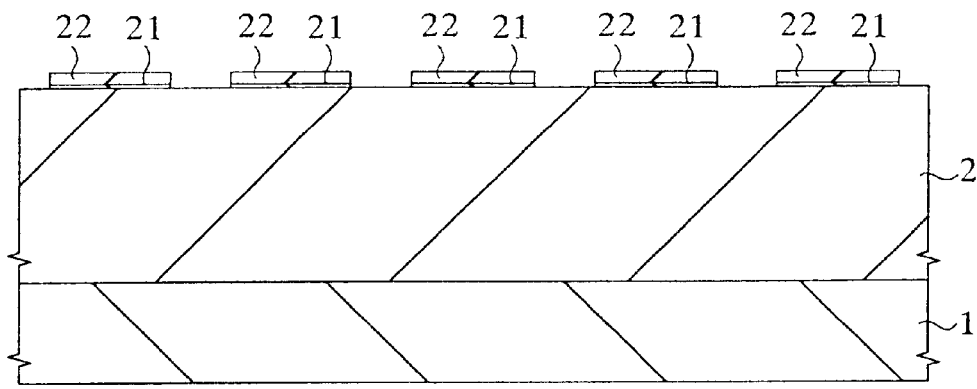
FIG. 9 is a cross-sectional view showing the method of manufacturing the AND-type flash memory according to the embodiment 1 in the order of its steps.

Next, as shown in FIG. 9, the silicon oxide film 21 and the silicon nitride film 22 are patterned such that openings are formed at regions where grooves are to be formed. This patterning uses photolithography and etching. The photoresist film is removed. The patterning is performed so that a striped pattern is formed. The flat pattern will be explained later.

Figure 10:
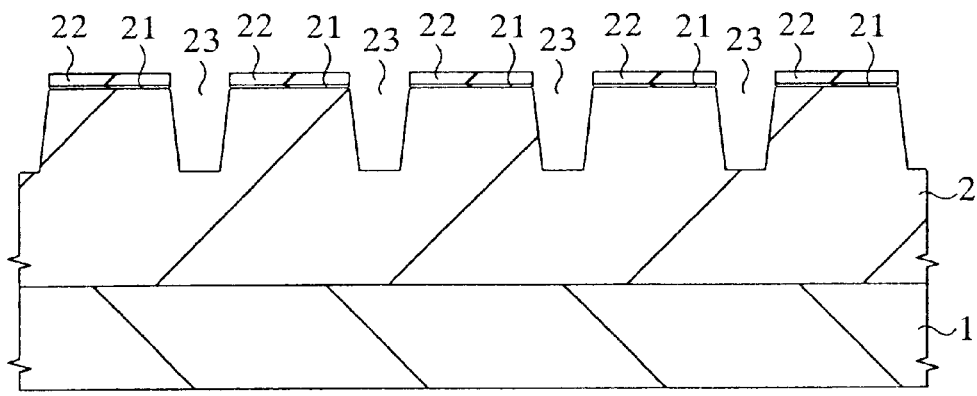
FIG. 10 is a cross-sectional view showing the method of manufacturing the AND-type flash memory according to the embodiment 1 in the order of its steps.

Next, as shown in FIG. 10, dry etching is performed with the patterned silicon nitride film 22 used as a mask, shallow grooves 23 are formed in the semiconductor substrate 1 (epitaxial layer 2). The depth of each shallow groove 23 is 0.4 μm and the width thereof is 0.35 μm. Each of regions to be active regions L located between the shallow grooves 23 has a width of 75 μm.

Figure 11:
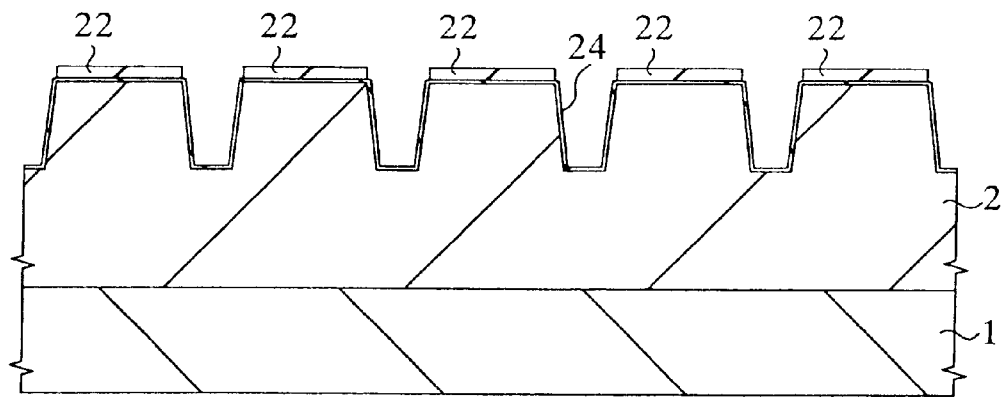
FIG. 11 is a cross-sectional view showing the method of manufacturing the AND-type flash memory according to the embodiment 1 in the order of its steps.

Next, as shown in FIG. 11, the internal surfaces of the shallow grooves 23 are oxidized to form a silicon oxide film 24. The silicon oxide film 24 recovers damages inside the shallow grooves 23 which are caused by dry etching. The film thickness of the silicon oxide film 24 is set to 10 nm.

Figure 12:
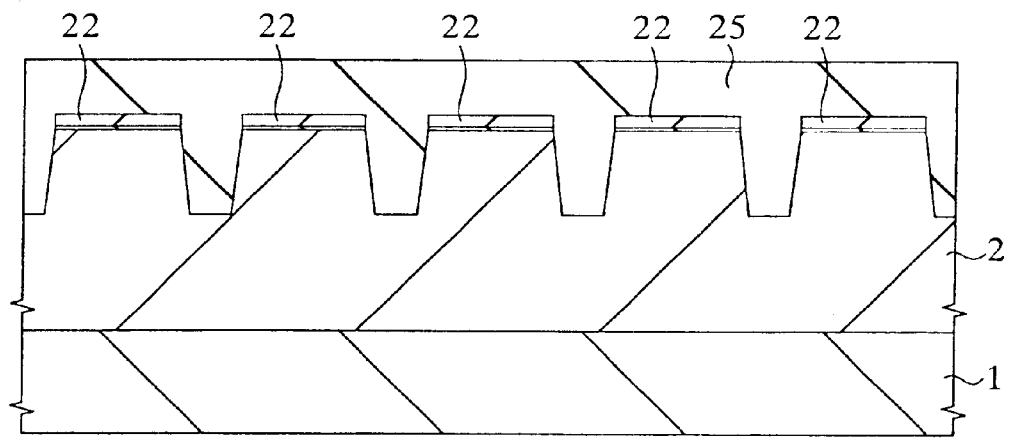
FIG. 12 is a cross-sectional view showing the method of manufacturing the AND-type flash memory according to the embodiment 1 in the order of its steps.

Next, as shown in FIG. 12, a silicon oxide film 25 which completely fills internally the shallow grooves 23 is formed. The silicon oxide film 25 is formed by a CVD method, for example, and the film thickness thereof is set to 600 nm. After depositing the silicon oxide film 25, a heat treatment is carried out for densification (baking). The heat treatment is carried out at a temperature of 1000° C. in a nitrogen atmosphere.

Figure 13:
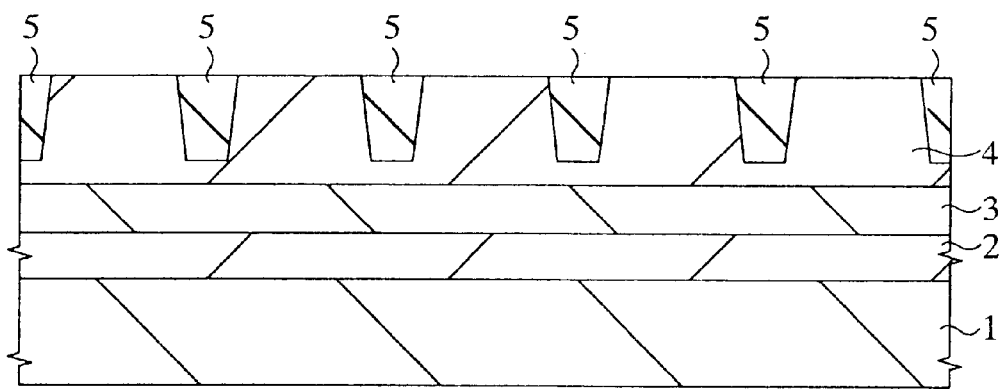
FIG. 13 is a cross-sectional view showing the method of manufacturing the AND-type flash memory according to the embodiment 1 in the order of its steps.

Next, as shown in FIG. 13, a CMP (Chemical Mechanical Polishing) method is used to polish the silicon oxide film 25. This polishing is performed until the silicon oxide film 22 is exposed. Since the polishing speed of the silicon nitride film 22 is lower than that of the silicon oxide film 25, the silicon nitride film 22 functions as a polishing stopper.

Next, the silicon nitride film 22 is removed with use of thermal phosphoric acid. As a result, the silicon oxide film 25 is embedded in the shallow grooves 23, as shown in FIG. 13, so element separation regions 5 are formed. Thereafter, ion implantation is carried out to form an n-type well 3 and a p-type well 4.

Figure 14:
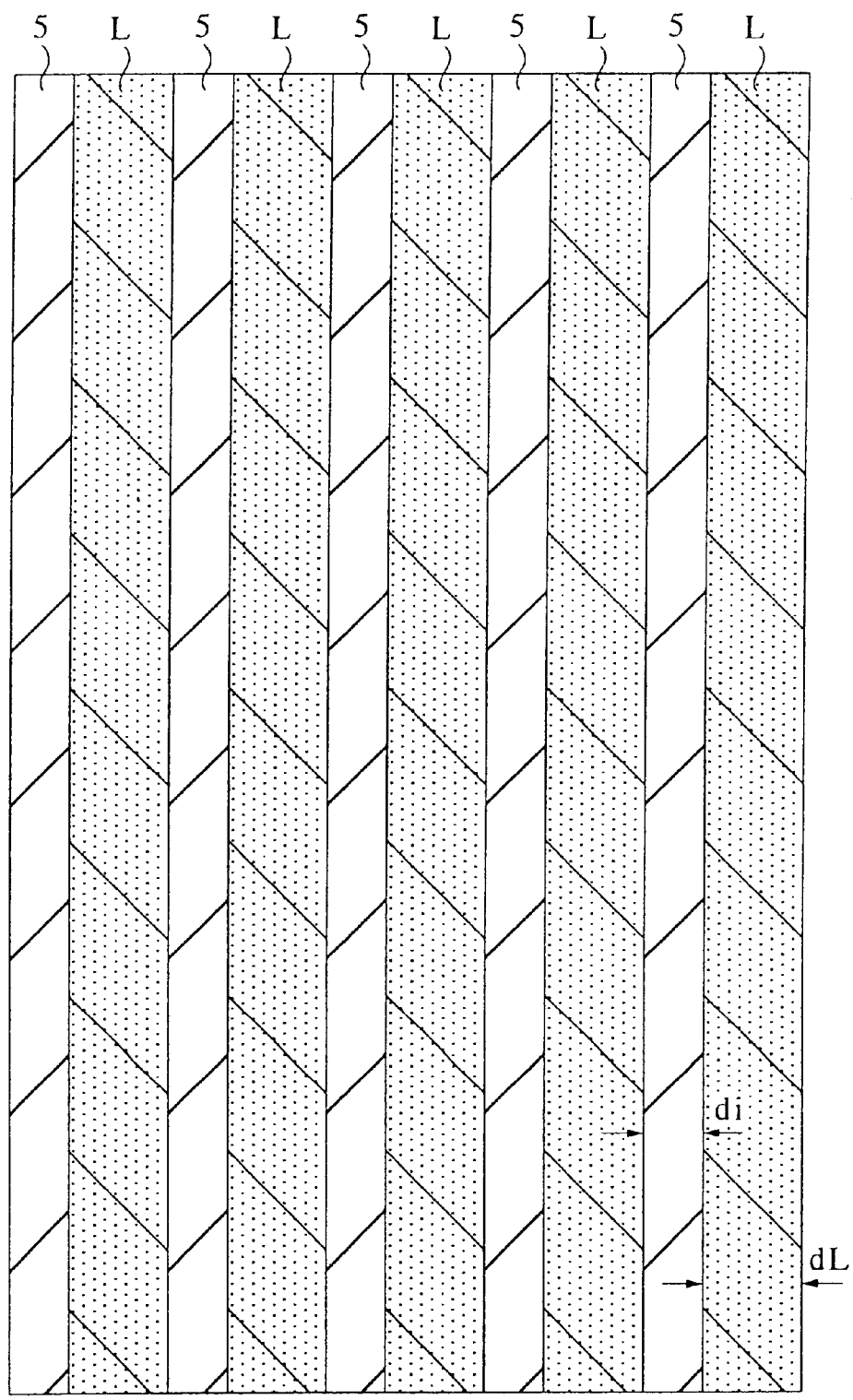
FIG. 14 is a cross-sectional view showing the method of manufacturing the AND-type flash memory according to the embodiment 1 in the order of its steps.

FIG. 14 is a plan view showing a flat pattern of the memory cell region up to the stage described above. As shown in FIG. 14, the element separation regions 5 are formed like stripes, and active regions L located between the regions 5 are also formed like stripes. As describe previously, each element separation region has a width di of 0.35 μm in the direction of its shorter edges. Each active region L has a width dL of 0.75 μm in the direction of its shorter edges.

Figure 15:
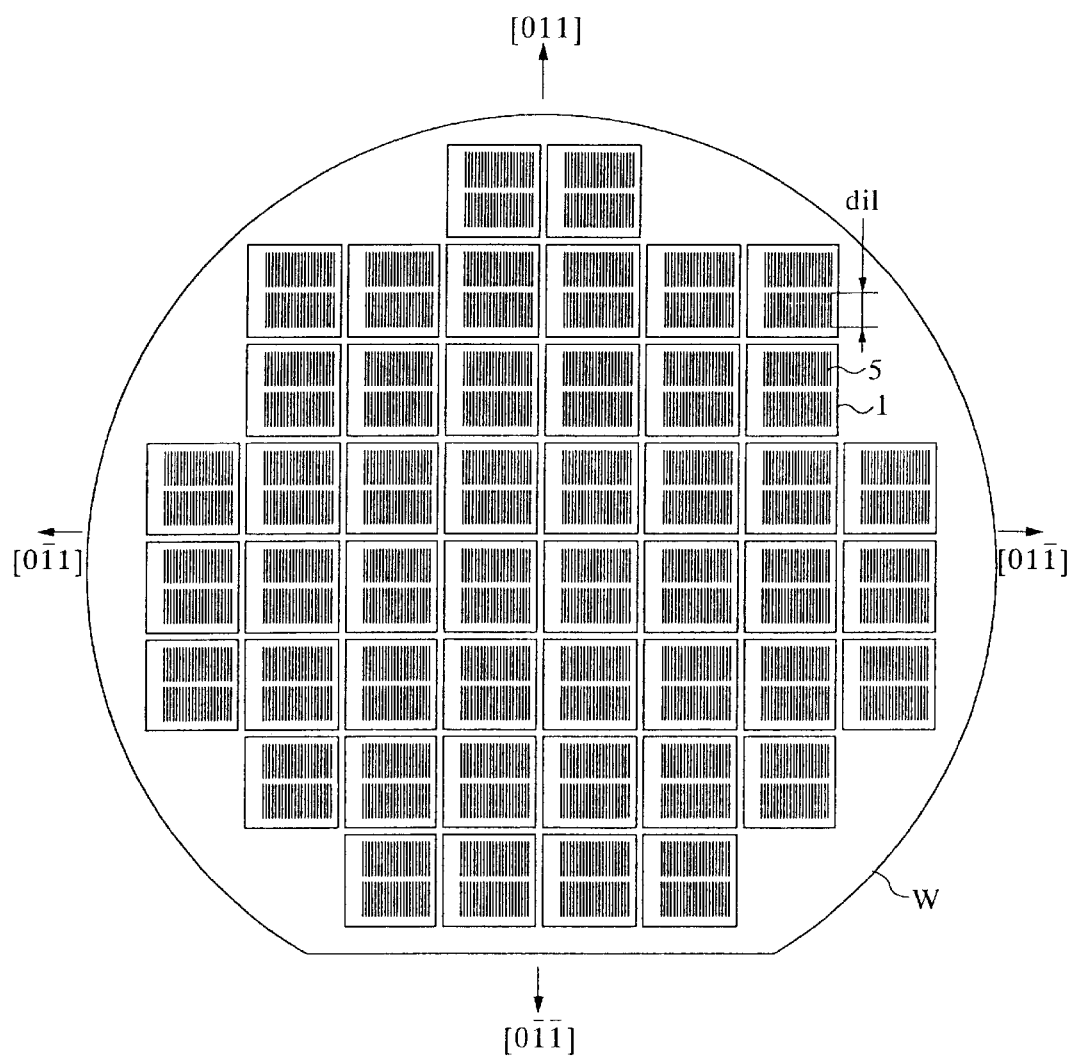
FIG. 15 is a plan view showing a state where element separation regions are formed on the entire surface of a wafer W.

FIG. 15 is a plan view showing a state where element separation regions are formed. A large number of element separation regions 5 are formed on the memory cell arrays MA for every chip 1. Simultaneously, a large number of active regions L are formed. The length dL1 of each active region L (i.e., the length di1 of the element separation region 5 in the direction of its longer edges) reaches 4.5 mm. As described above, in the AND flash memory according to the present embodiment, 128 memory cells are formed in every one block. The length of each block is about 70 μm. Since 64 blocks are repeated, the length of the blocks reaches 4.5 mm. Throughout this length, each active region L is not interrupted but is formed as one stripe pattern. Therefore, the ratio of the longer edge of the stripe pattern of the active region L to the shorter edge thereof reaches 6000 times. According to discussions made by the present inventors, a probability of causing an error due to dislocation defects appears when the ratio of the longer edge of the stripe pattern of the active region L to the shorter edge thereof reaches 100 times or so. Accordingly, advantages of the present invention can be obtained effectively when the ratio of the longer edge to the shorter edge is 100 times or more.

As shown in the figure, the stripe patterns of the active regions L are formed in parallel with each other so as to extend in the direction [011] as a crystal orientation. The main surface of the semiconductor substrate 1 is the (100) surface. This is required from the following grounds. The chip 1 is rectangular and each strip pattern is elongated as described above, and therefore, the stripe patterns should preferably be formed to be parallel or vertical to the end surfaces of the chip, to effectively use the chip area. In addition, taken into consideration that the end surfaces of the chip are scribed later to cut out the chip, the end surfaces should preferably be matched with the direction [011] or [011] in which the end surfaces of the chip easily cleave. That is, to adopt a pattern layout which allows easy cut-out of a chip and effective use of the chip area, the stripe patterns of the active regions L are compelled to extend in the [011] direction or the [011] direction. Accordingly, the stripe patterns of the active regions L are matched with the [011] direction. This means easy occurrence of dislocation defects in the direction of the longer edges of the element separation regions 5. Also, a silicon oxide film is embedded in the element separation regions 5 as described above. The silicon oxide film has a compressive stress with respect to the silicon substrate. Further, from the pattern shape, it is possible to estimate that a stress tends to be applied easily in the direction of the longer edges. Therefore, the above-described requirements concerning the surface orientation and the factors depending on the stripe patterns are superimposed on each other, resulting in a possibility to cause dislocation defects over a very long distance (about 4.5 mm at most). Dislocation defects of this kind lowers the yield of the flash memory and deteriorates the reliability, as explained previously.

If another surface orientation than the (100) surface is selected as the main surface of the semiconductor substrate 1, the direction of the stripe patterns is selected to be parallel or vertical to the cleavage surfaces.

However, in the present embodiment, since a silicon monocrystal substrate doped with nitrogen is used as the semiconductor substrate 1, occurrence of dislocation defects in the active regions L can be reduced more effectively. In this mechanism of reducing dislocation defects, oxygen is trapped by an impurity side caused by nitrogen or carbon, and micro crystal defects are caused. These micro defects terminate the growth of dislocation defects and restricts more growth of dislocation defects. If these preferable micro defects are caused, i.e., if a large amount of nitrogen or carbon impurities is doped, it is possible to effectively restrict dislocation defects as a result and to contribute to improvements in the yield of the elements and the reliability, even in the stress circumstance which easily causes dislocation or even under the condition concerning the crystal orientation.

The present embodiment shows an example in which the (100) surface is used as the main surface of the semiconductor substrate 1 and the stripe patterns of the active regions L are formed to be longer in the direction [011] of the wafer W. Needless to say, however, the stripe patterns may be formed to be longer in the direction [011], or stripe patterns elongated in the direction [011] and stripe patterns elongated in the direction [011] may be mixed on one chip.

Figure 16:
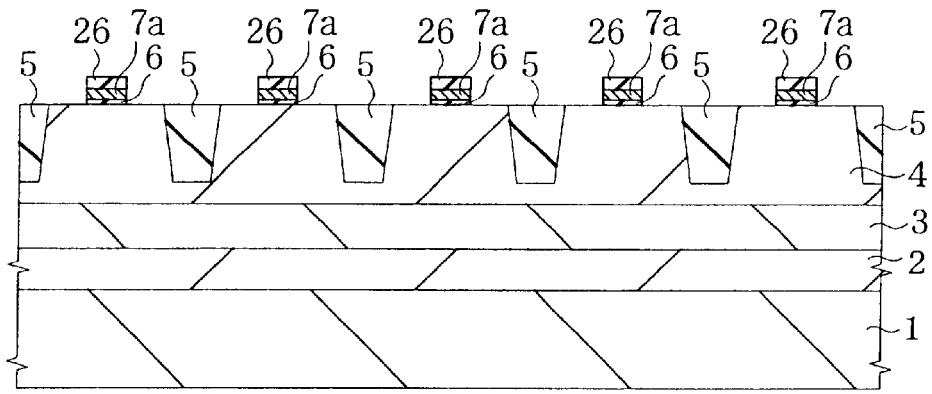
FIG. 16 is a cross-sectional view showing the method of manufacturing the AND-type flash memory according to the embodiment 1 in the order of its steps.
Figure 19:
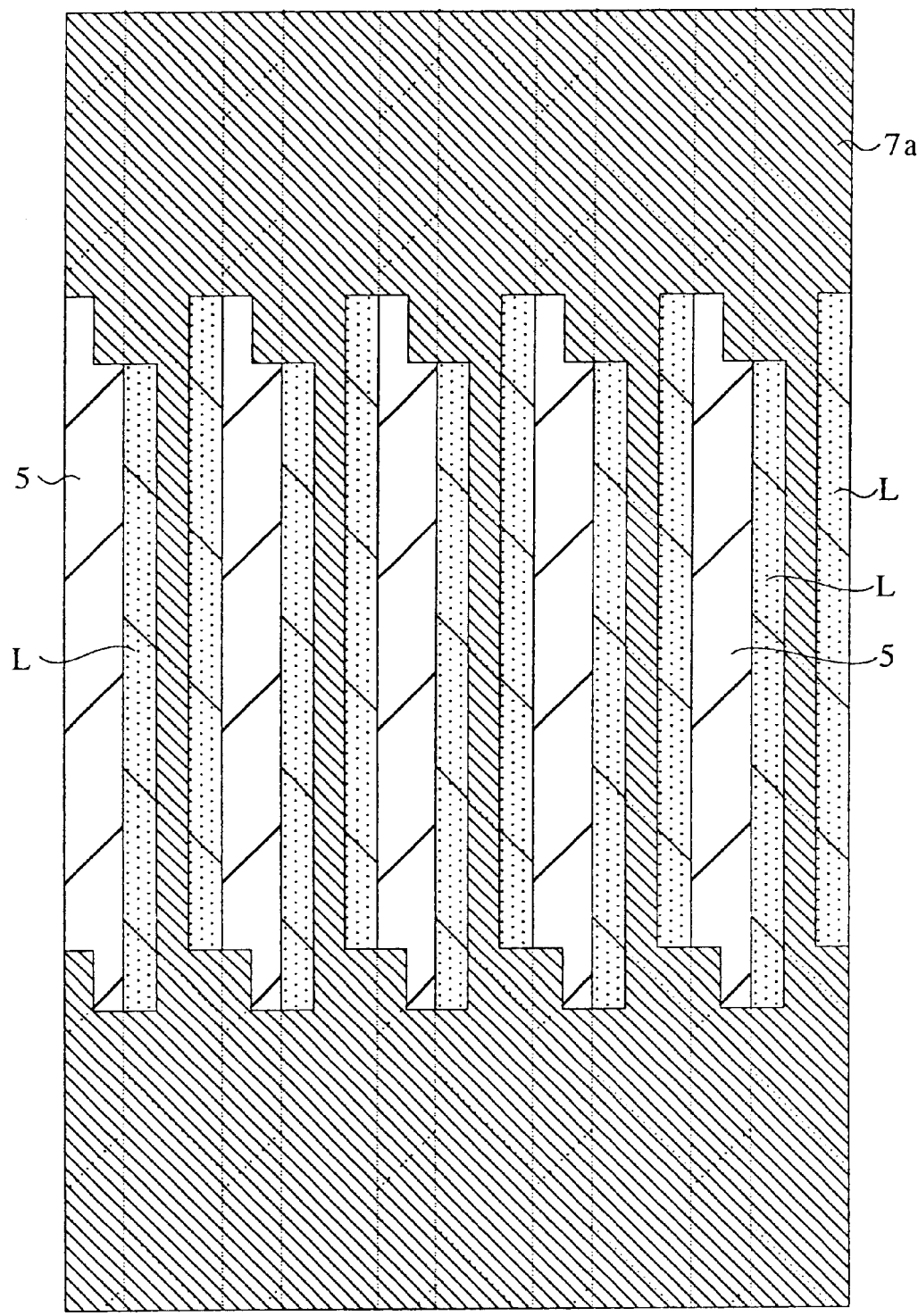
FIG. 19 is a cross-sectional view showing the method of manufacturing the AND-type flash memory according to the embodiment 1 in the order of its steps.

Next, as shown in FIG. 16, a silicon oxide film to form a tunnel oxide films is formed to be 9 nm thick. Thereafter, a polycrystal silicon film to form lower floating gates 7 is formed to be 100 nm thick. Further, a silicon nitride film to form a cap insulting film is formed to be 170 nm thick. Thereafter, these films are subjected to patterning. In this manner, a tunnel oxide film 6, a pattern 7a to form lower floating gates 7, and a cap insulating film 26 are formed. Photolithography and dry etching are used for the patterning. FIG. 19 is a plan view showing the flat pattern of this patterning. FIG. 19 shows the pattern 7a to form lower floating gates 7. As shown in the figure, in the region where memory cells are formed, the pattern 7a is shaped like stripes along the stripe lines of the active regions L. The regions where switch transistors SWMOS are formed are covered so that impurities might not be doped by ion-implantation in the next step.

Figure 17:
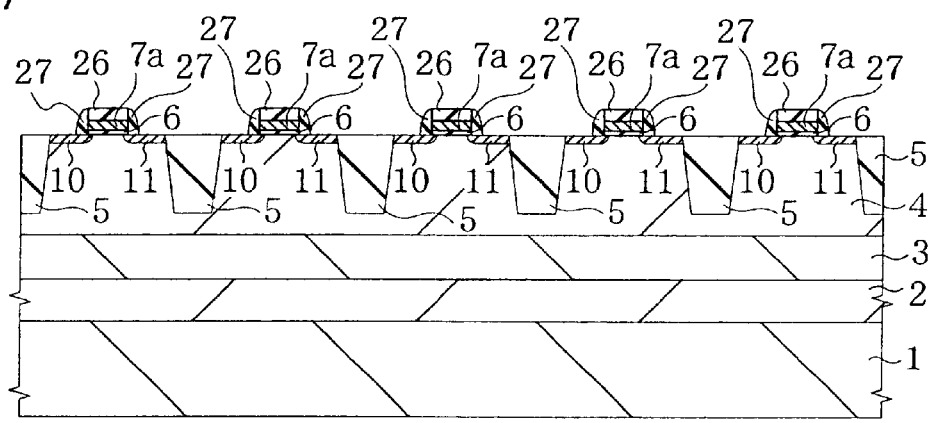
FIG. 17 is a cross-sectional view showing the method of manufacturing the AND-type flash memory according to the embodiment 1 in the order of its steps.

Next, a source diffusion layer (source regions 10 and local source lines LSL) and a drain diffusion layer (drain regions 11 and local data lines LDL) are formed as shown in FIG. 17. At this time, the lower floating gates 7 and the cap insulating films 26 serve as a mask for ion implantation. Further, a silicon oxide film is deposited on the entire surface and is subjected to anisotropic etching, to form side wall spacers 27 on the side walls of the lower floating gates 7 and the cap insulating films 26.

Figure 18:
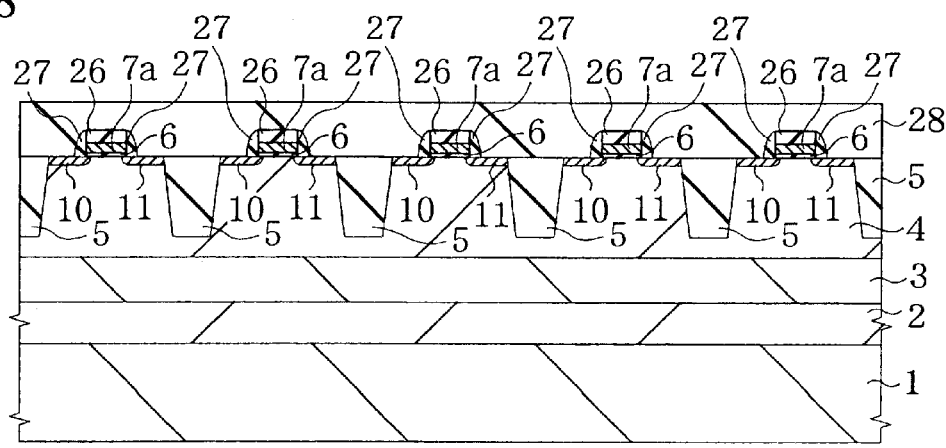
FIG. 18 is a cross-sectional view showing the method of manufacturing the AND-type flash memory according to the embodiment 1 in the order of its steps.
Figure 20:
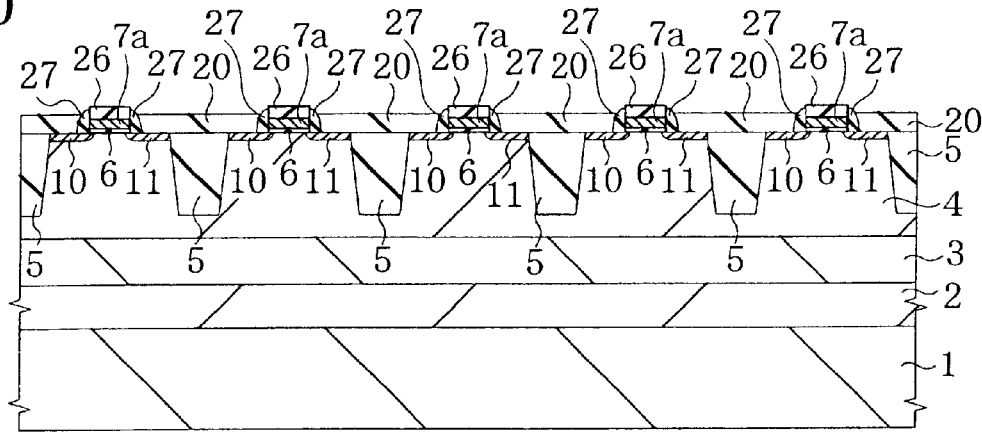
FIG. 20 is a cross-sectional view showing the method of manufacturing the AND-type flash memory according to the embodiment 1 in the order of its steps.

Next, as shown in FIG. 18, a silicon oxide film 28 for filling the gaps of the lower floating gates 7 is deposited. As shown in FIG. 20, this silicon oxide film 28 is polished by the CMP method until the cap insulating films 26 are exposed. Further, etching-back may be carried out. In this manner, insulating films 20 are formed between the lower floating gates 7. The film thickness of the silicon oxide film 28 is set to 600 nm. After deposition of this film, a heat treatment may be carried out for densification. The heat treatment is carried out under a condition of 850° C. in a nitrogen atmosphere.

Figure 21:
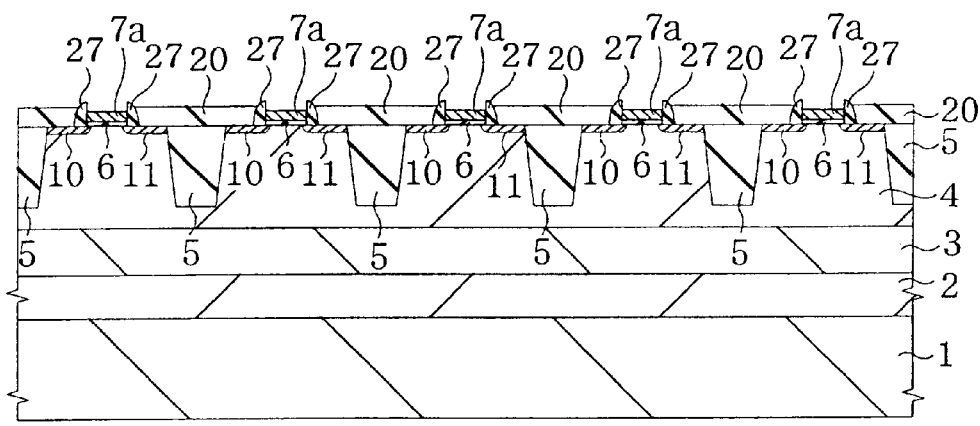
FIG. 21 is a cross-sectional view showing the method of manufacturing the AND-type flash memory according to the embodiment 1 in the order of its steps.

Next, as shown in FIG. 21, the cap insulating films 26 are removed by thermal phosphoric acid, thereby to expose the surfaces of the lower floating gates 7.

Figure 22:
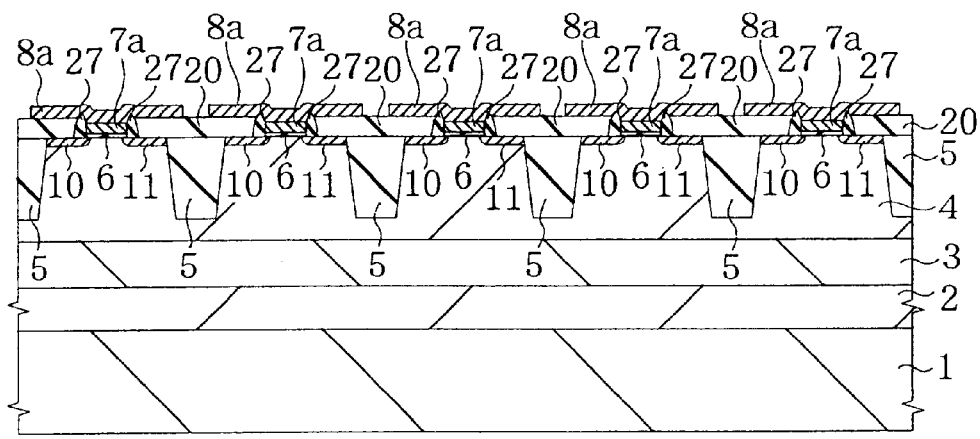
FIG. 22 is a cross-sectional view showing the method of manufacturing the AND-type flash memory according to the embodiment 1 in the order of its steps.
Figure 23:
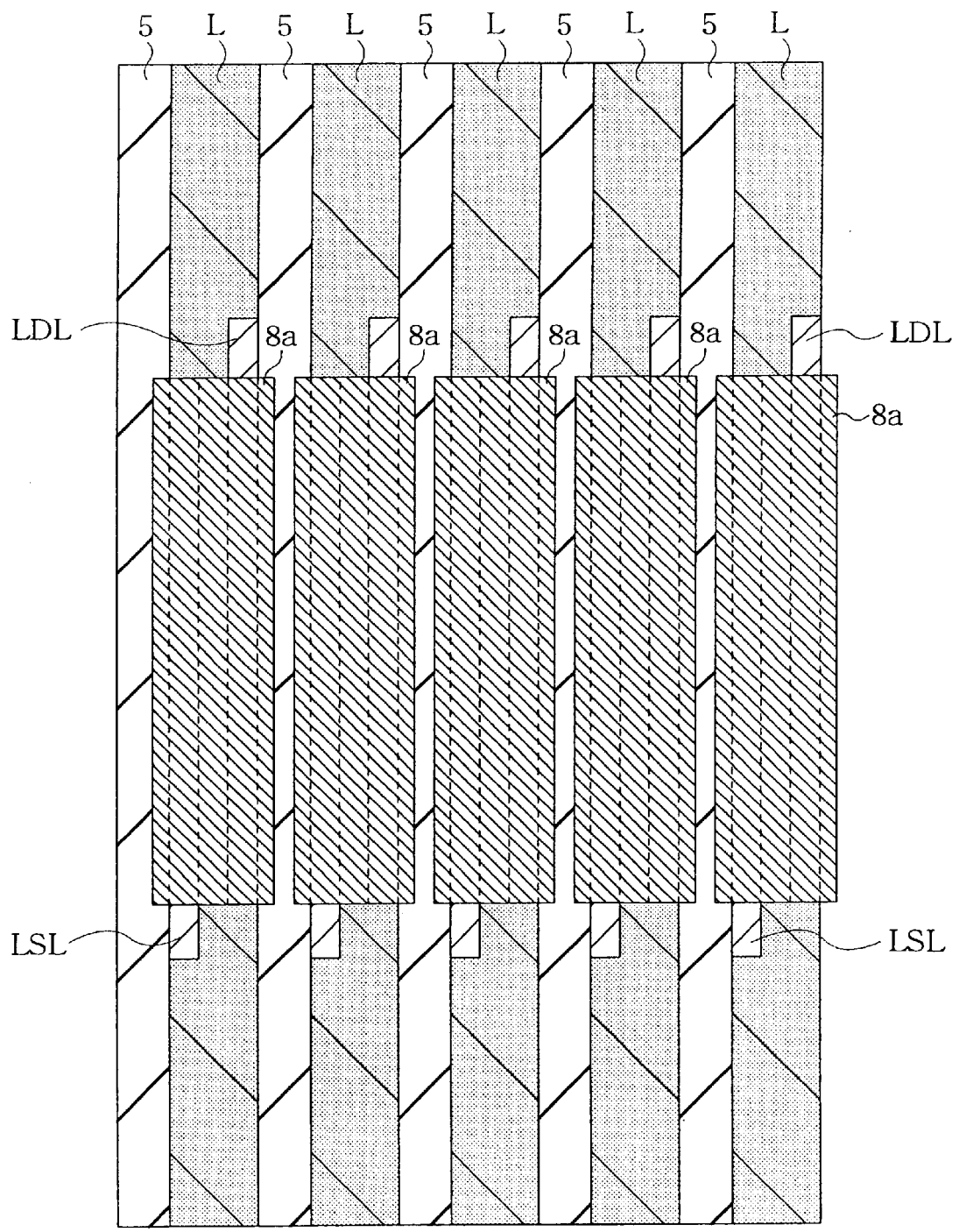
FIG. 23 is a cross-sectional view showing the method of manufacturing the AND-type flash memory according to the embodiment 1 in the order of its steps.

Next, a polycrystal silicon film entirely doped with impurities is deposited. This film is subjected to patterning as shown in FIG. 22, thereby to form a pattern 8a to form upper floating gates 8. FIG. 23 is a plan view showing the flat pattern of the pattern 8a. As shown in this figure, the pattern 8a is formed to be such a pattern that has slits in the memory cell forming region. The regions where switch transistors SWMOS are formed are removed together with the lower floating pattern 7a.

Figure 24:
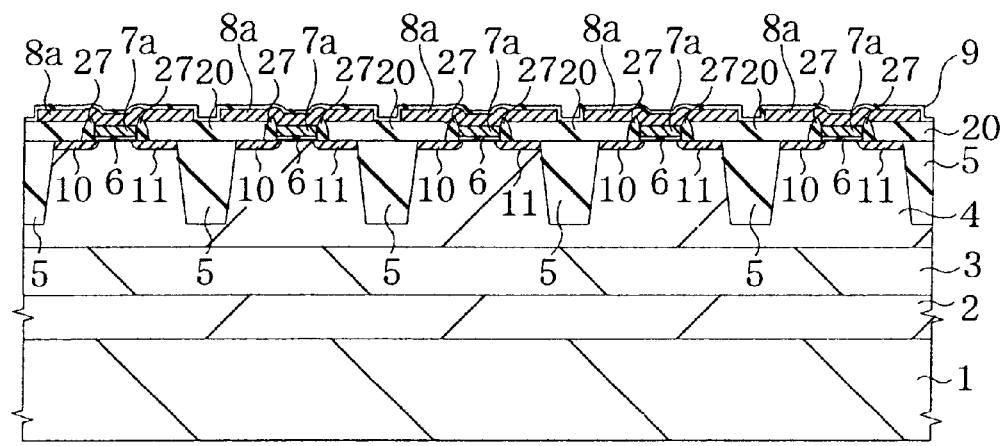
FIG. 24 is a cross-sectional view showing the method of manufacturing the AND-type flash memory according to the embodiment 1 in the order of its steps.

Next, as shown in FIG. 24, an interlayer insulating film 9 for insulating the floating gates from the control gates is formed. The interlayer insulating film 9 is formed by the CVD method and is made of a layer film comprised of a silicon oxide film, a silicon nitride film, and a silicon oxide film.

Figure 25:
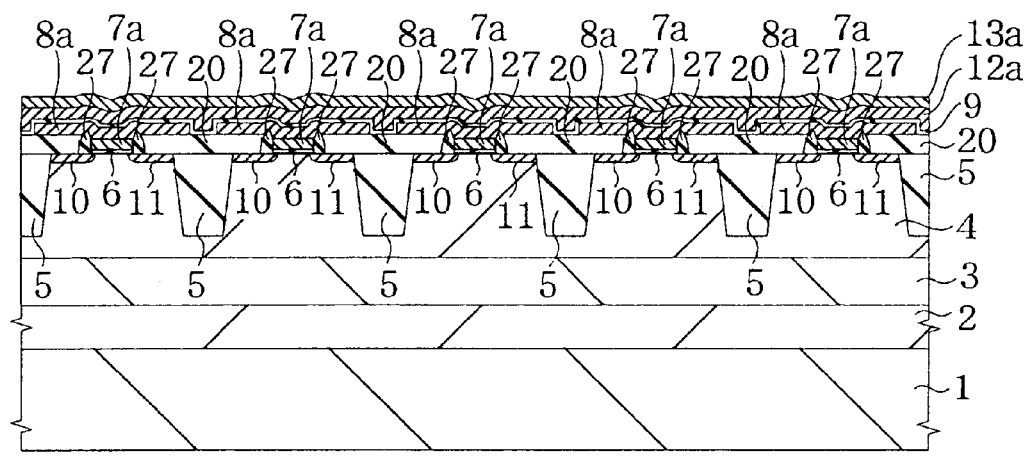
FIG. 25 is a cross-sectional view showing the method of manufacturing the AND-type flash memory according to the embodiment 1 in the order of its steps.
Figure 26:
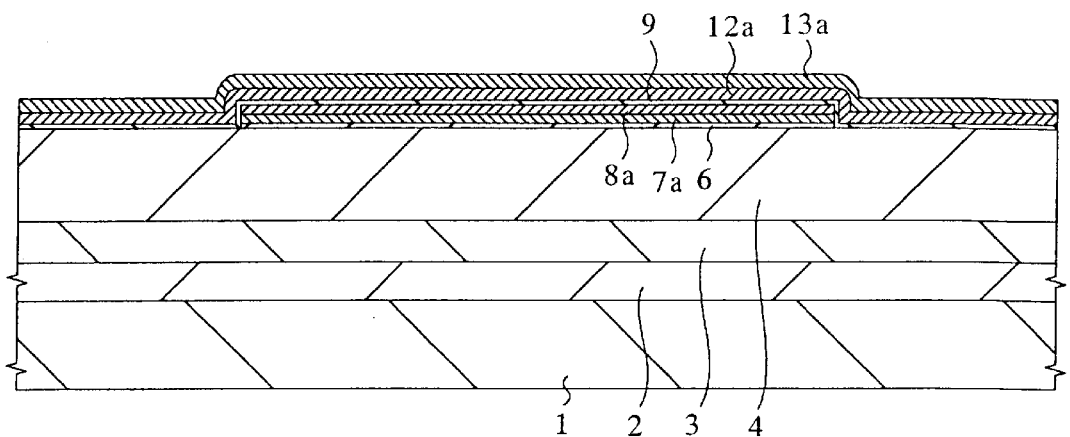
FIG. 26 is a cross-sectional view showing the method of manufacturing the AND-type flash memory according to the embodiment 1 in the order of its steps.

Next, as shown in FIG. 25, a polycrystal silicon film 12a doped with impurities are formed on the interlayer insulating film 9. Further, a tungsten silicide film 13a is formed. The tungsten silicide film 13a has a function to raise the conductivity of the control gates (word lines WL). FIG. 26 is a cross-sectional view showing a cross-section cut along the line A—A in FIG. 3 in this stage.

Figure 27:
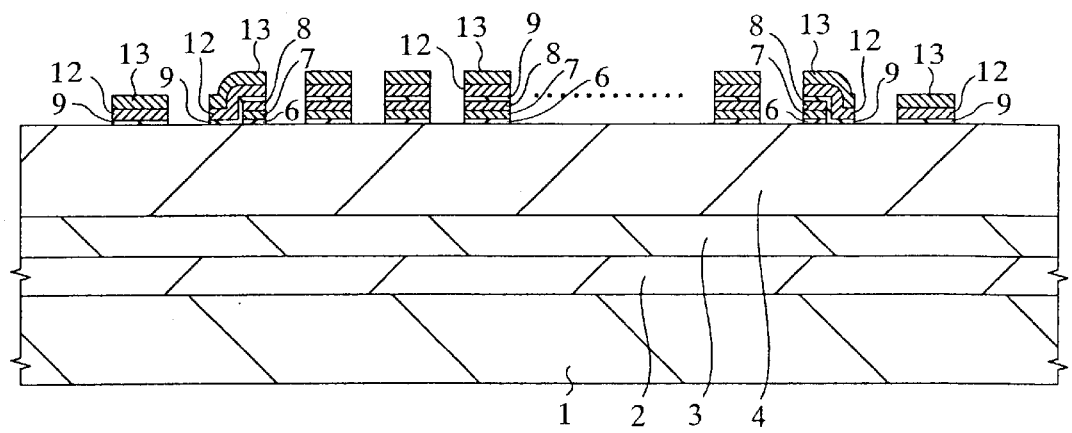
FIG. 27 is a cross-sectional view showing the method of manufacturing the AND-type flash memory according to the embodiment 1 in the order of its steps.
Figure 28:
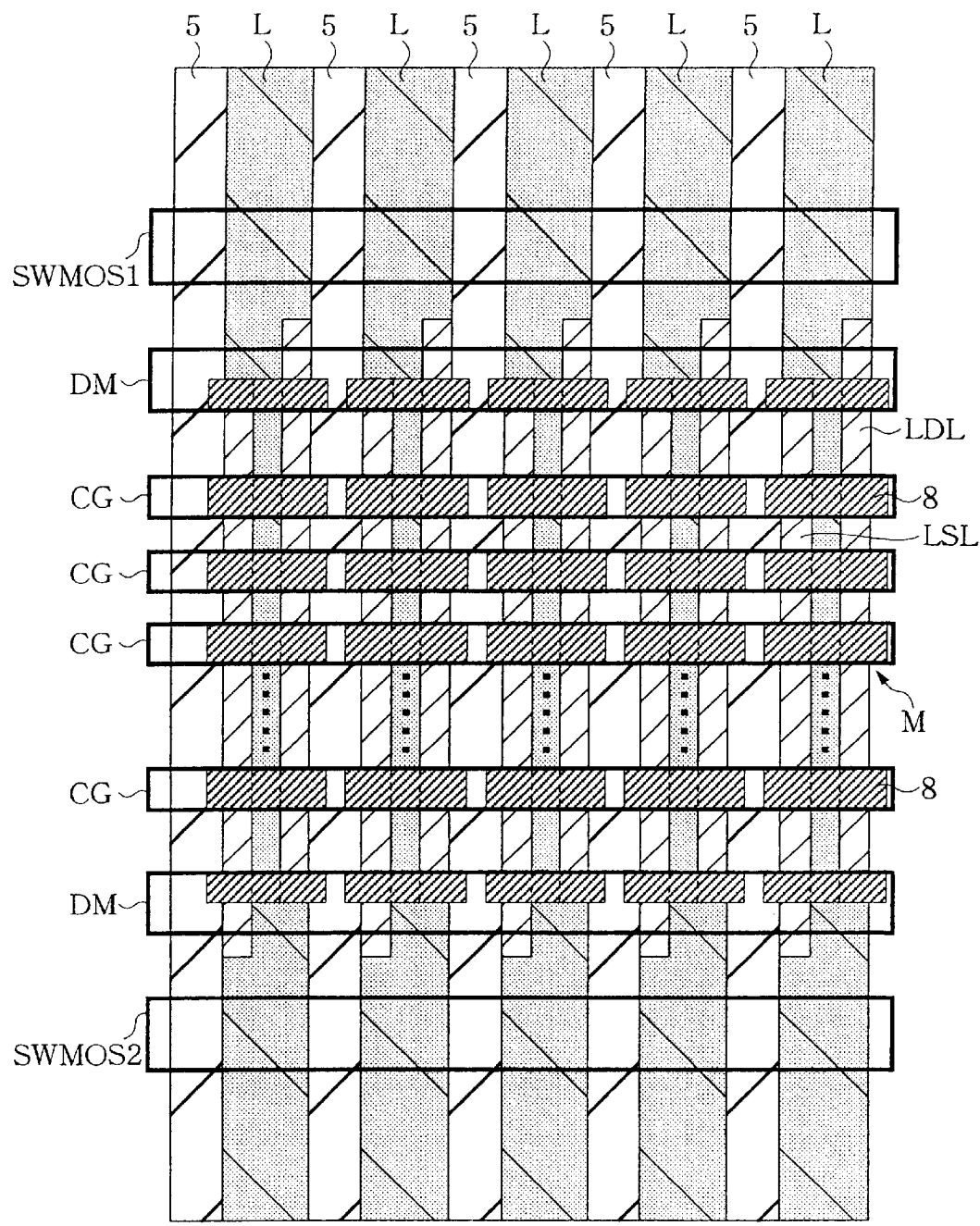
FIG. 28 is a cross-sectional view showing the method of manufacturing the AND-type flash memory according to the embodiment 1 in the order of its steps.

Next, as shown in FIG. 27, the tungsten silicide film 13a, the polycrystal silicon film 12a, the interlayer insulating film 9, the upper floating gate pattern 8a, the lower floating gate pattern 7a, and the tunnel oxide film 6 are subjected to patterning. In this manner, the lower floating gates 7, the upper floating gates 8, and the control gates CG (12 and 13) are formed in the memory cell region. Meanwhile, the dummy gates DM and the gate electrodes of the switch transistors SWMOS are formed in the peripheral portion. FIG. 28 shows a flat pattern in this stage. The control gates CG (12 and 13), the dummy gates DM, and the gate electrodes of the switch transistors SWMOS are patterned so as to extend in a direction vertical to the stripe patterns of the active regions L.

Figure 29:
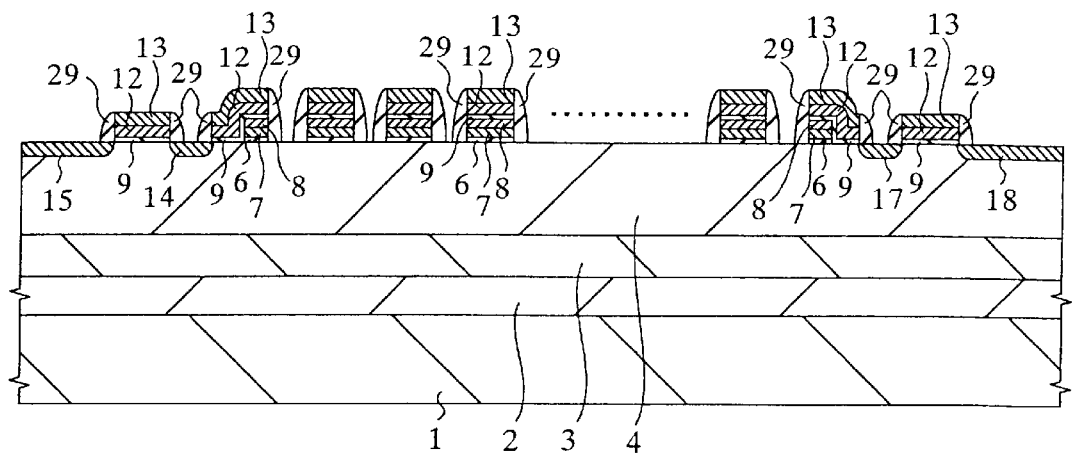
FIG. 29 is a cross-sectional view showing the method of manufacturing the AND-type flash memory according to the embodiment 1 in the order of its steps.

Next, as shown in FIG. 29, source/drain regions 14, 15, 17, and 18 of the switch transistors SWMOS are formed by ion implantation, using a photoresist film as a mask. Further, a silicon oxide film is deposited and is thereafter subjected to anisotropic etching, thereby to form side wall spacers 29 on the side walls of the patterns.

Figure 30:
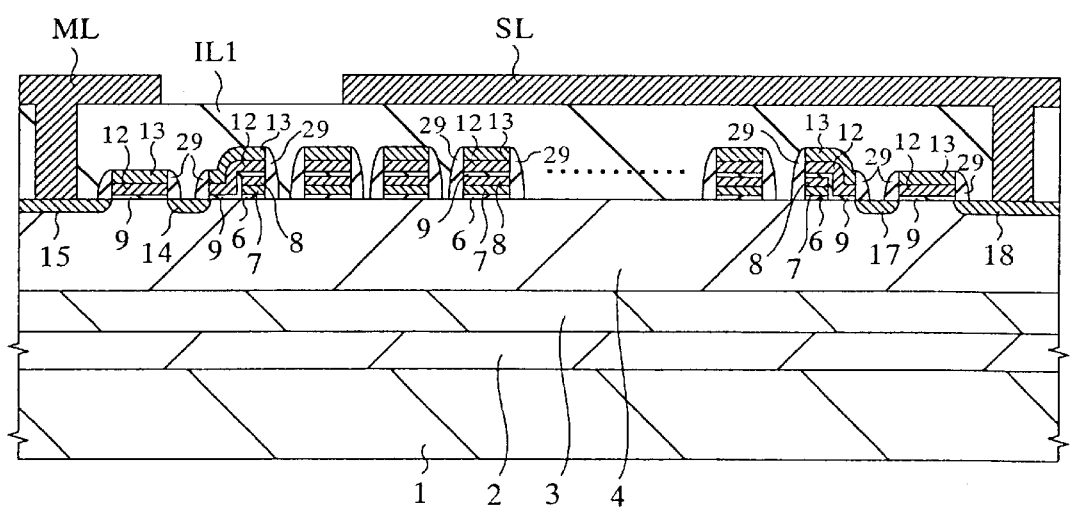
FIG. 30 is a cross-sectional view showing the method of manufacturing the AND-type flash memory according to the embodiment 1 in the order of its steps.

Further, as shown in FIG. 30, for example, a silicon oxide film is deposited to form an insulating film IL1. Contact holes are formed in the insulating film IL1. A source line SL to be connected to the source/drain region 18 of the switch transistor SWMOS2, is formed. A lead wire ML to be connected to the source/drain region 15 of the switch transistor SWMOS2 is formed. To form the source line SL and the lead wire ML, for example, a layered film comprised of a titanium nitride film and a tungsten film can be used. A metal silicide layer can be formed at the bottom portions of through holes, thereby to reduce the contact resistance. Also, a sputtering method or a CVD method can be used for forming the layered film comprised of the titanium nitride film and the tungsten film. Photolithography and etching can be used for patterning of the layered film.

Further, upper-layer wires can be formed in a similar manner. Thus, the AND-type flash memory shown in FIGS. 3, 4, and 5 is completed.

Figure 31:
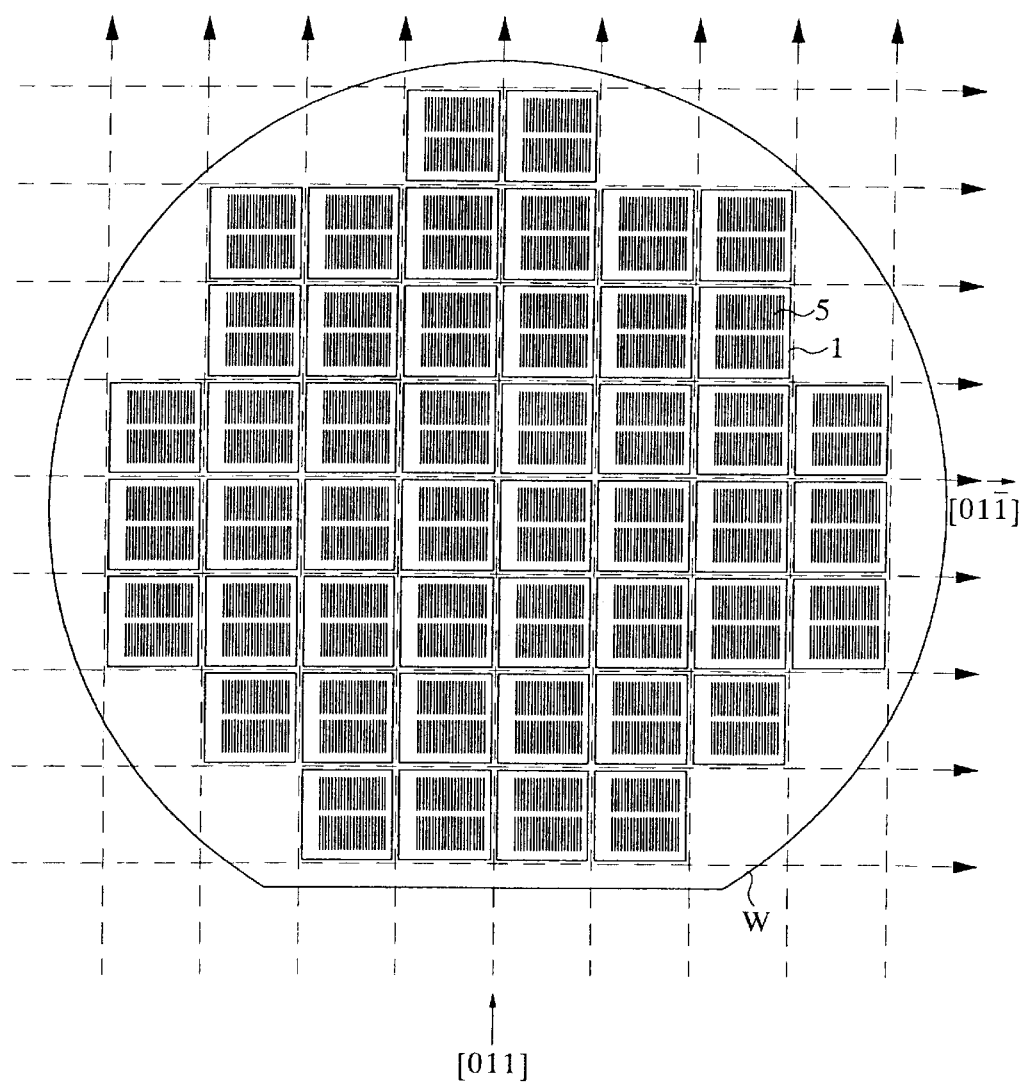
FIG. 31 is a plan view showing a dicing step of the embodiment 1.

The wafer after completion of wafer processing is put into a dicing step, as shown in FIG. 31, and is cut into chips. The (100) surface is used as the main surface of the semiconductor substrate 1. The cutting is carried out in the directions

[011] and [011], as shown in the figure. By the dicing in these directions, the wafer can be easily cut by utilizing cleavage of the wafer. Although a mechanical load is applied to some extent through the dicing step, the wafer according to the present embodiment is excellent in mechanical strength so that occurrence of dislocation defects is restricted within the active regions L.

According to the present embodiment, a monocrystal substrate doped with nitrogen is used as the semiconductor substrate 1. Therefore, dislocation defects can be prevented, and junction leakages of elements can be prevented.

Figure 32A:
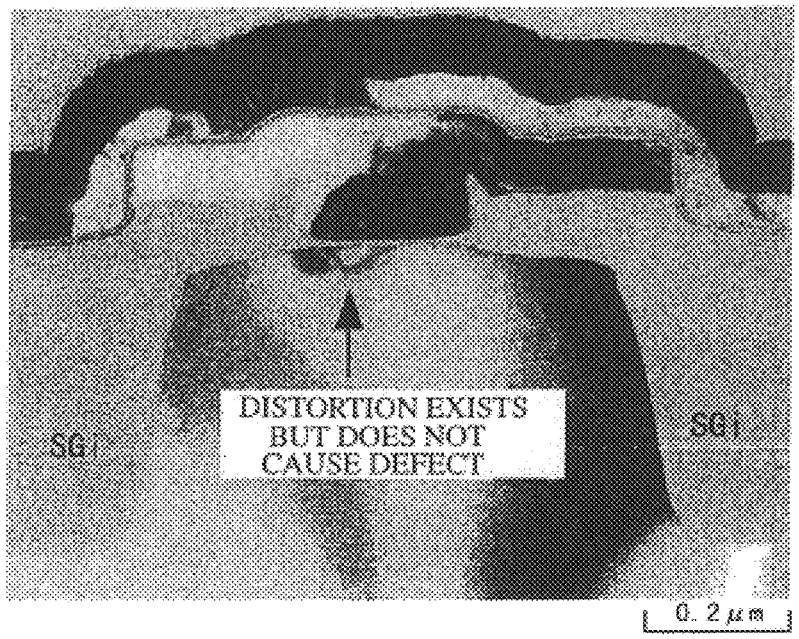
FIG. 32(a) is a TEM photograph observing a memory element part of an AND-type flash memory manufactured by applying the embodiment 1.
Figure 32B:
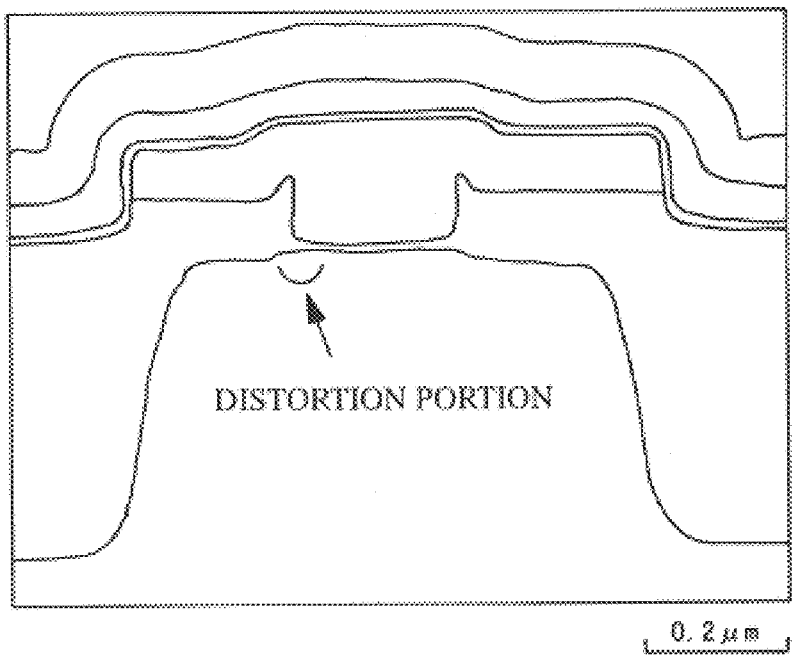
FIG. 32(b) is a schematic view obtained by tracing the photograph.

FIG. 32(a) shows a TEM photograph in which the memory element part of an AND-type flash memory manufactured by applying the present embodiment is observed. FIG. 32(b) shows a schematic view in which the TEM photograph is traced. Although distortion exists in the active region, no defect is found and the mechanical strength is improved.

Figure 33:
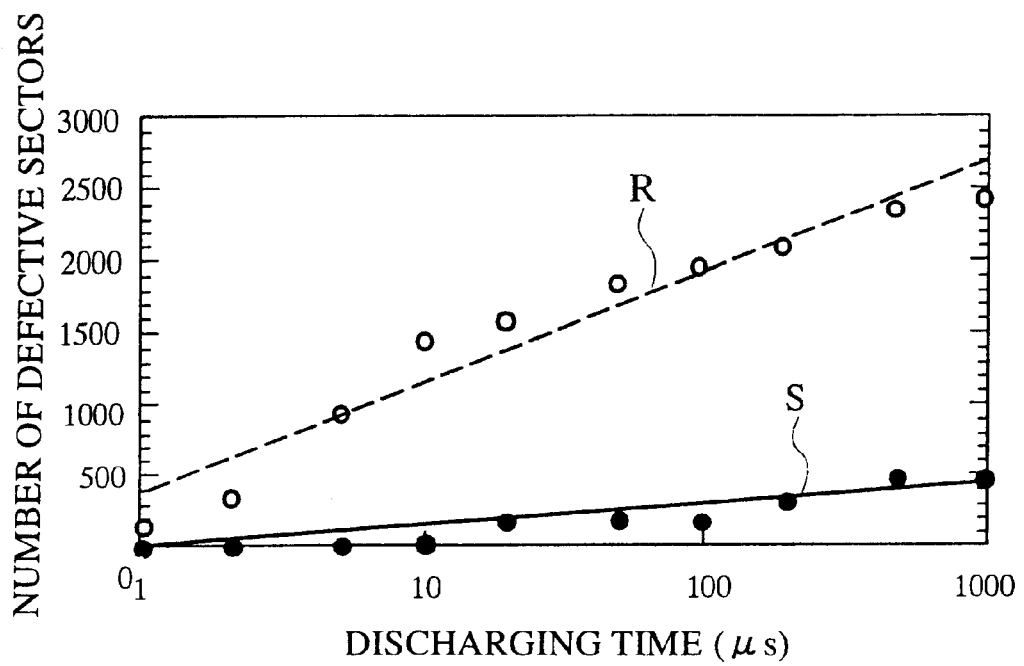
FIG. 33 is a graph showing a result of measuring the dependency of read errors on the discharge time in an AND-type flash memory manufactured by applying the embodiment 1.
Figure 55A:
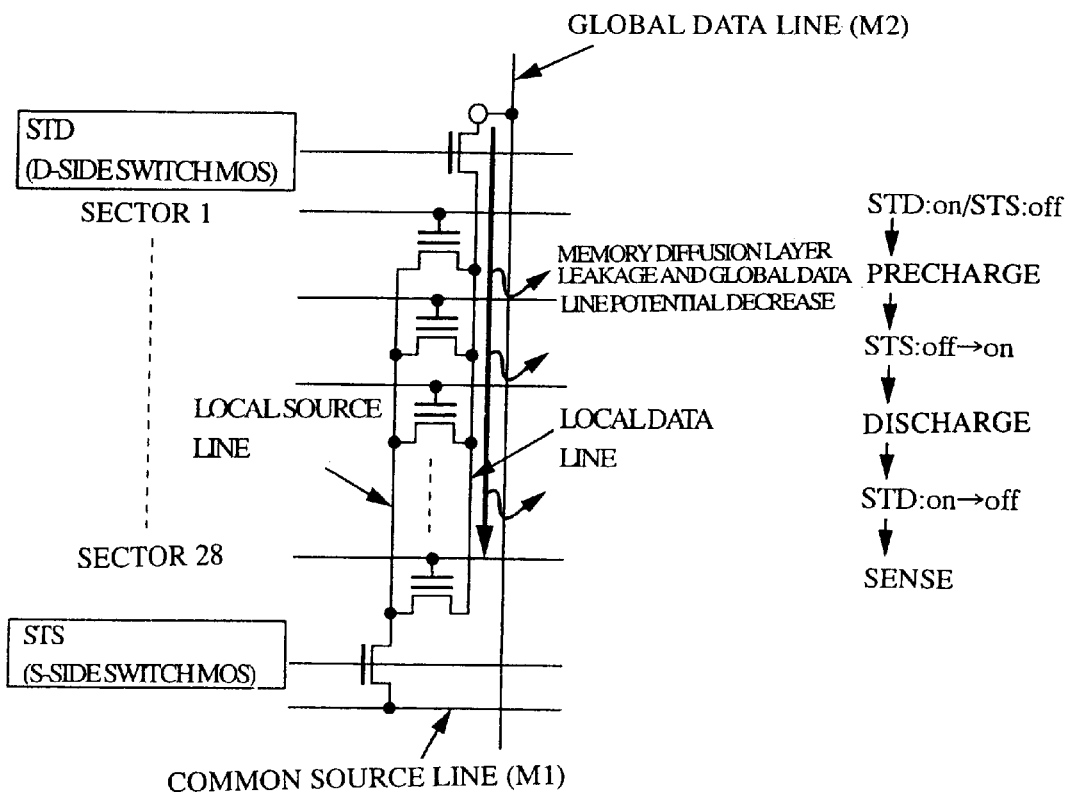
FIG. 55(a) is a circuit diagram explaining a read sequence of an AND-type flash memory.
Figure 55B:
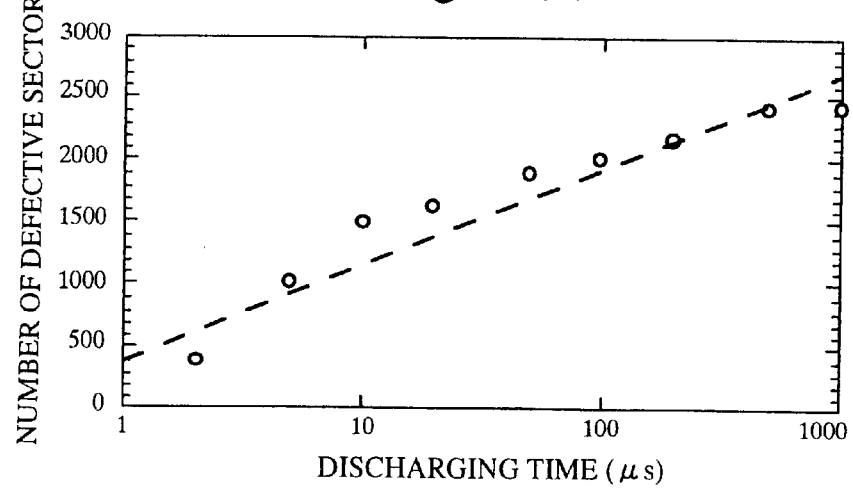
FIG. 55(b) is a graph showing the dependency of the number of defective sectors which cause read errors on the discharge time.

FIG. 33 shows a result (line S) of a measurement in which the dependency of read errors on the discharge time explained with reference to FIG. 55 was measured with respect to a flash memory according to the present embodiment. A prior art example (line R) to which the present embodiment is applied is shown together to make a comparison. As is apparent from the figure, it is found that the number of defective sectors is greatly reduced in the flash memory according to the present embodiment.

Figure 34:
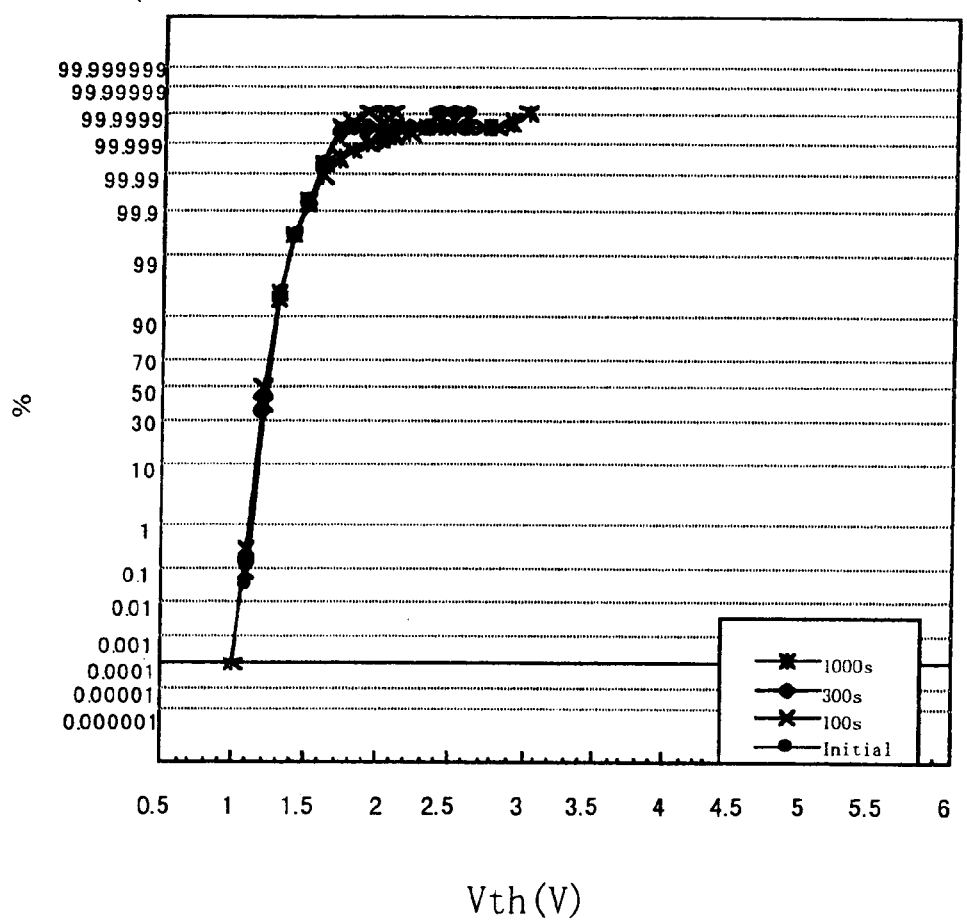
FIG. 34 is a graph in which the shifts of the threshold voltage of an AND-type flash memory manufactured by applying the embodiment 1 are normally plotted.
Figure 56A:
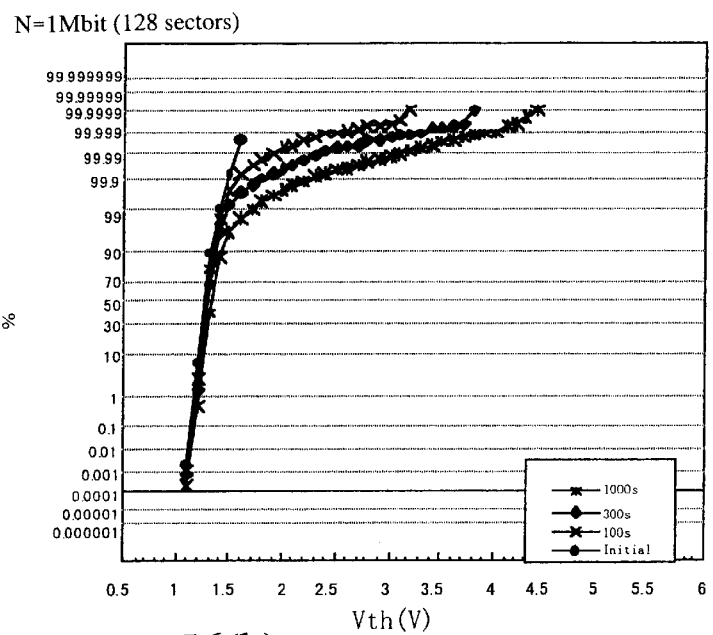
FIG. 56(a) is a graph in which the shifts of the threshold voltage are normally plotted.
Figure 56B:
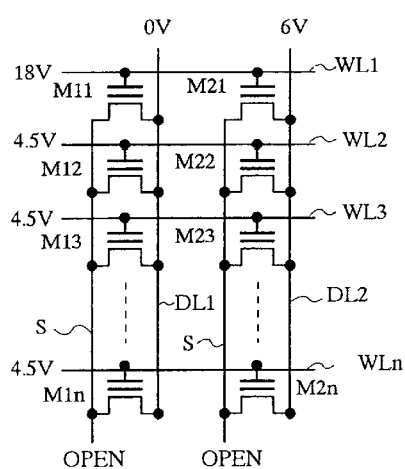
FIG. 56(b) is a circuit diagram explaining the drain disturbance.
Figure 56C:
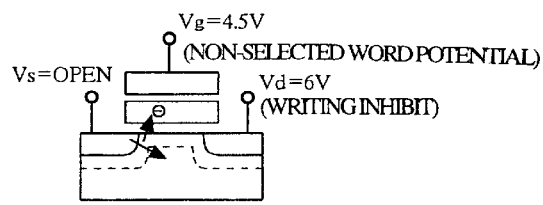
FIG. 56(c) is a conceptual cross-sectional view showing a memory cell part.

FIG. 34 is a graph in which shifts of the threshold voltage caused by the drain disturbance explained with reference to FIG. 56 are expressed as a normal plot. The shifts are measured by a flash memory according to the present embodiment. Compared with the graph shown in FIG. 56(a), the drain disturbance is improved apparently. That is, if a voltage is applied for about 1000 s, the rate of those sectors that incur a shift of Vth exceeding 2.1 V as a required specification stays at 0.001%. In case where the present invention is not applied, the rate of those sectors reaches 0.1%. Compared with this case, the reliability is improved progressively.

(Embodiment 2)

Figure 35:
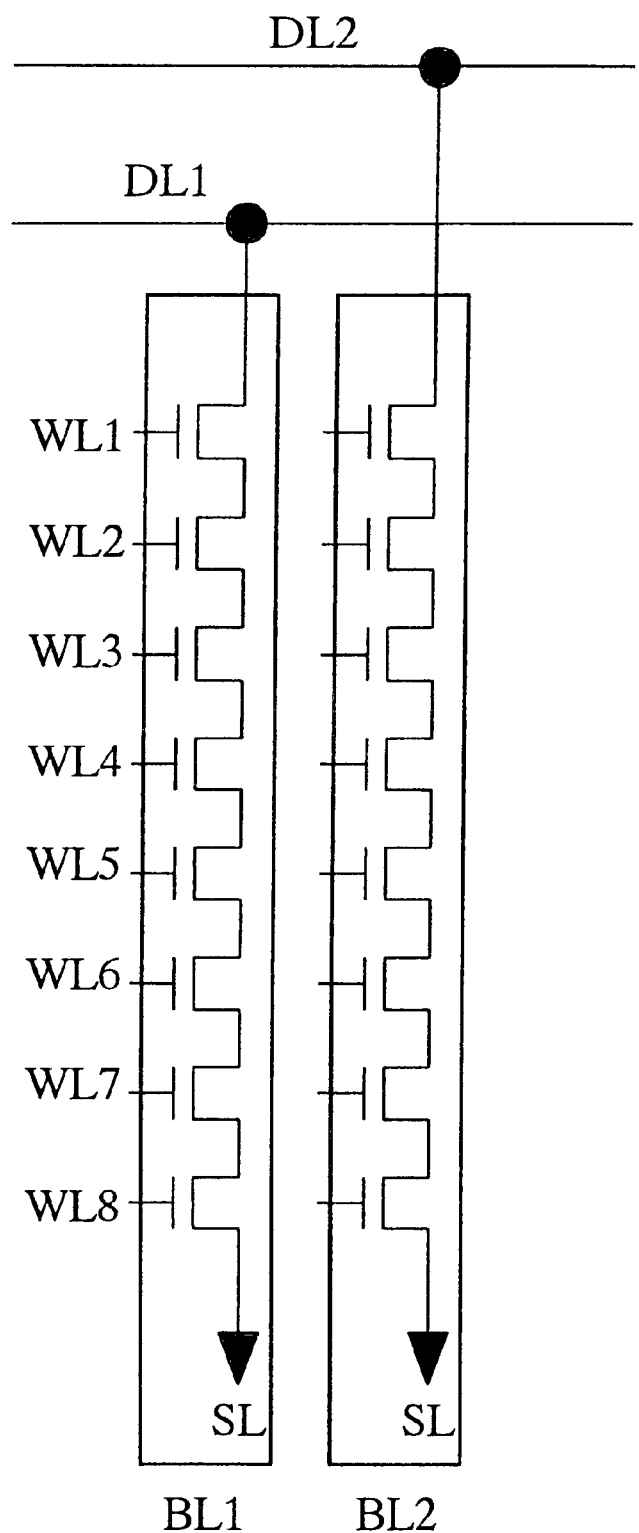
FIG. 35 is an equivalent circuit diagram showing an example of a NAND-type mask ROM as another embodiment (embodiment 2) of the present invention.

FIG. 35 is an equivalent circuit diagram showing an example of a NAND mask ROM according to another embodiment of the present invention. Eight memory cells each constructed by one transistor are connected in series thereby forming one block. Of the cells at two ends of each block, one is connected to a data line DL and the other is connected to a source line SL. The source line SL is constructed by a diffusion layer. One data line DL is assigned to each block. Gate electrodes of MISFETs of each block are respectively connected to gate electrodes of MISFETs of an adjacent block, thereby forming word lines WL.

FIG. 36 is a table showing a condition concerning read voltages of the NAND-type mask ROM according to the present embodiment. This table shows a case where the word line WL2 is selected. The data lines DL are applied with a voltage Vcc, and the source lines SL are set to 0 V. The other word lines (WL1 and WL3 to 8) than the selected word line WL2 are maintained at a high voltage (VGH). Transistors connected to these non-selected word lines are turned on. Meanwhile, the selected word line WL2 is maintained at 0 V. Information is read out by determining whether or not the corresponding cell (transistor) is turned on.

FIGS. 37 to 42 are plan views or cross-sectional views showing the method of manufacturing the NAND-type mask ROM according to the present embodiment in the order of its steps.

Figure 37:
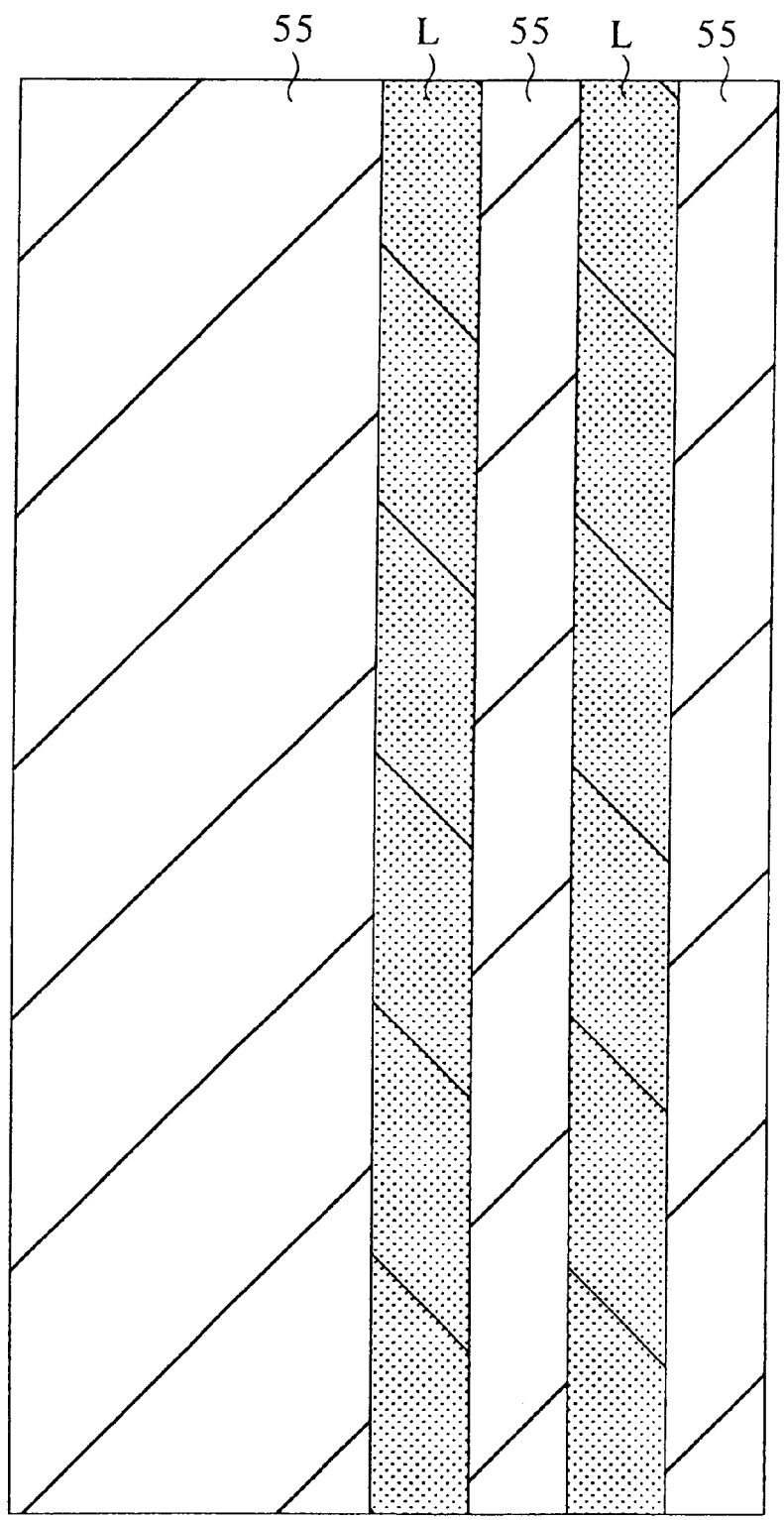
FIG. 37 is a plan view showing the method of manufacturing the NAND-type mask ROM according to the embodiment 2 in the order of its steps.

In the method according to the present embodiment, element separation regions 55 are formed on the main surface of the semiconductor substrate 51 having an epitaxial layer 52, like the embodiment 1. The element separation regions according to the present embodiment are formed like stripes as shown in FIG. 37, like the embodiment 1. The semiconductor substrate 51 is also the same as the semiconductor substrate in the embodiment 1. That is, a silicon monocrystal substrate is used as the semiconductor substrate 51. Therefore, the present embodiment has also stripe-like active regions L. However, errors such as junction leakages caused by dislocation defects can be reduced because the semiconductor substrate 51 doped with nitrogen or carbon is used.

Figure 38:
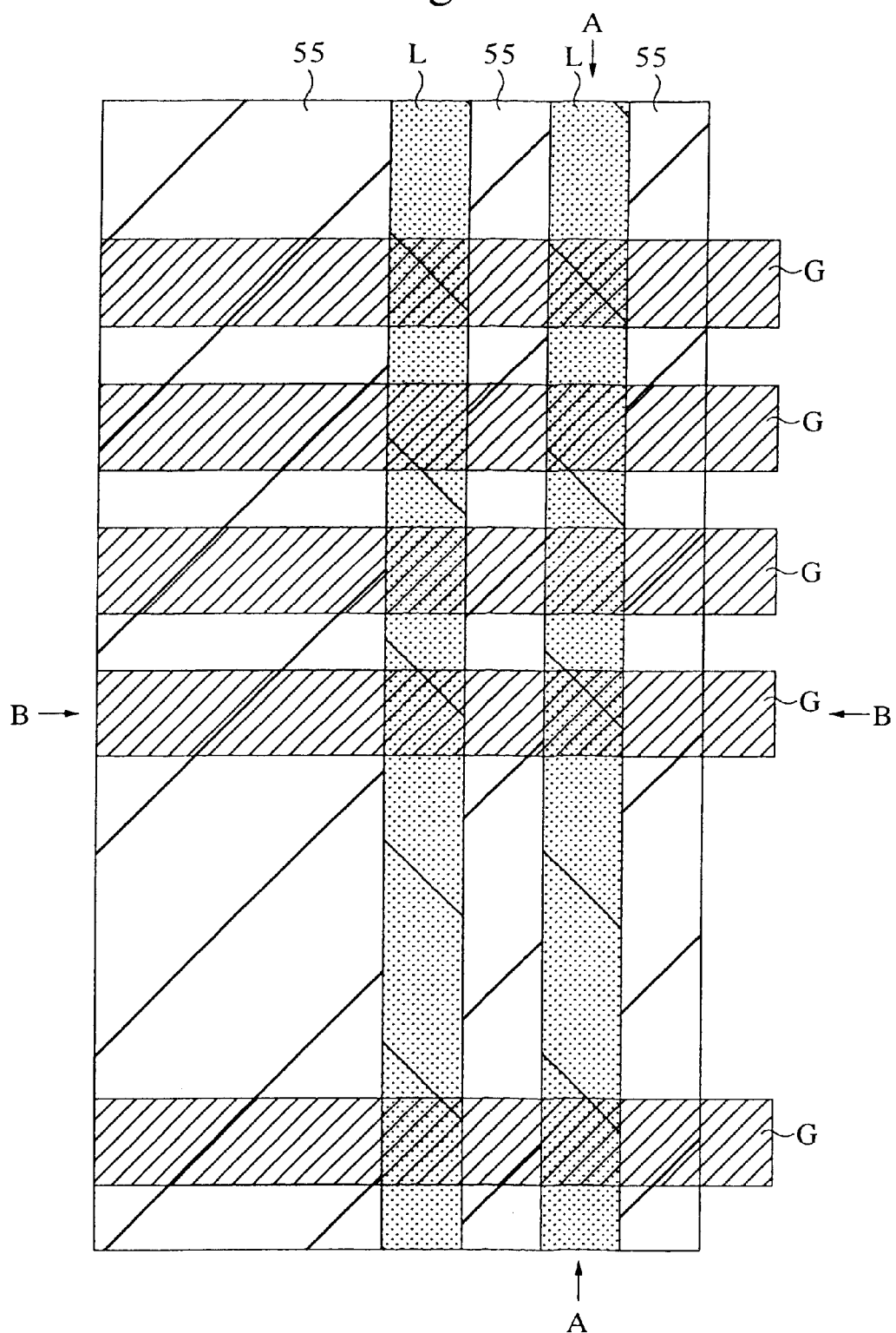
FIG. 38 is a plan view showing the method of manufacturing the NAND-type mask ROM according to the embodiment 2 in the order of its steps.
Figure 39:
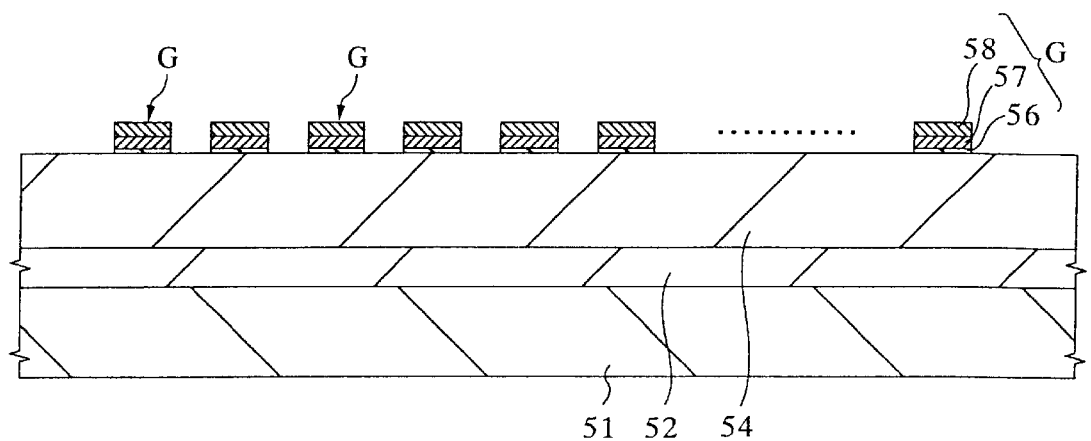
FIG. 39 is a cross-sectional view showing the method of manufacturing the NAND-type mask ROM according to the embodiment 2 in the order of its steps.

Next, as shown in FIG. 38, gate electrodes G are formed. The gate electrodes G are formed by depositing a polycrystal silicon film and a tungsten silicide film with a gate insulating film 56 inserted thereunder, and by patterning the tungsten silicide film and the polycrystal silicon film. FIG. 39 shows a cross-sectional view in this stage. FIG. 39 is a cross-sectional view cut along the line A—A in FIG. 38. On he main surface of the semiconductor substrate 51 having the epitaxial layer 52, gate electrodes G made of a polycrystal silicon film 57 and a tungsten silicide film 58 are formed with a gate insulating film 56 inserted thereunder, as described previously. In the present embodiment, it is unnecessary to apply a well potential, and therefore, n-type wells for isolating p-type wells 54 are not formed. The gate insulating film 56, the polycrystal silicon film 57, and the tungsten silicide film 58 can be formed in the same manner as described in the embodiment 1. Of course, channel ion plantation is carried out for programs.

Figure 40:
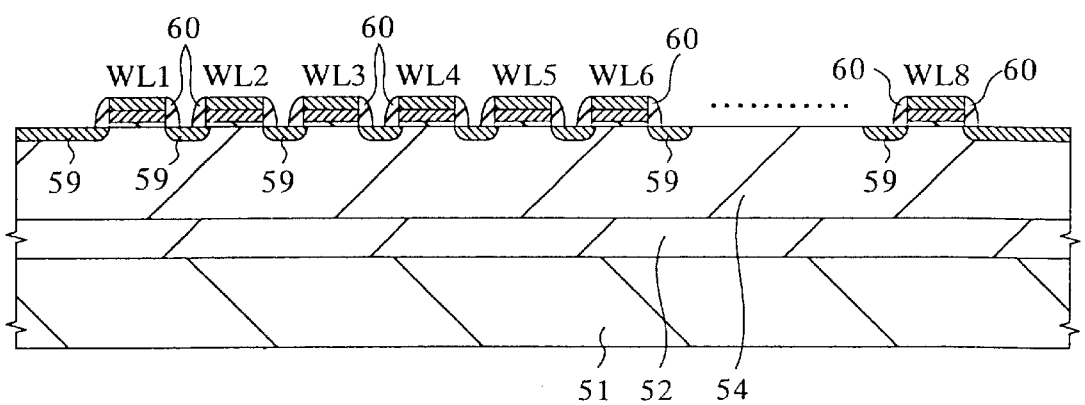
FIG. 40 is a cross-sectional view showing the method of manufacturing the NAND-type mask ROM according to the embodiment 2 in the order of its steps.

Next, as shown in FIG. 40, ion implantation is carried out with the gate electrodes G used as a mask, thereby to form source/drain regions 59. Memory cells are connected in series by these source/drain regions 59. Thereafter, side wall spacers 60 are formed on the side walls of the gate electrodes. The side wall spacers 60 are formed in the same manner as that in the embodiment 1.

Figure 41B:
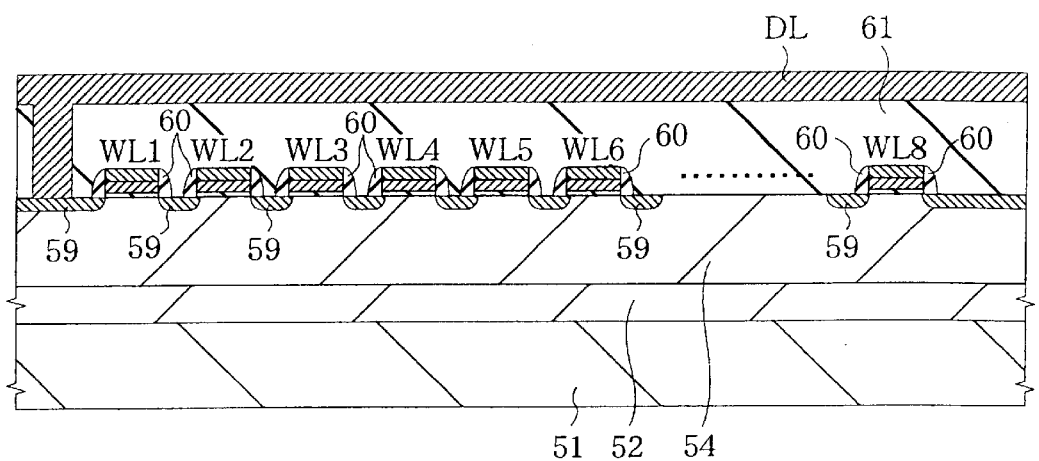
FIG. 41(b) is a cross-sectional view cut along the line B—B in FIG. 38 in this step.
Figure 41A:
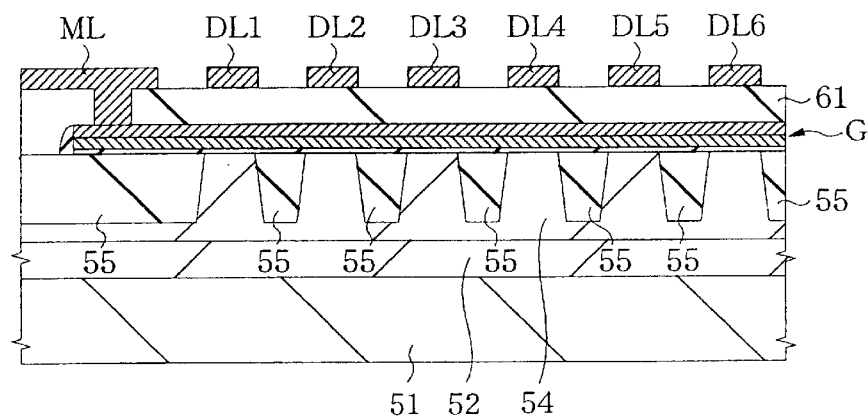
FIG. 41(a) is a cross-sectional view showing the method of manufacturing the NAND-type mask ROM according to the embodiment 2 in the order of its steps.

Next, as shown in FIG. 41(a), an insulating film 61 which covers the gate electrodes G is formed, and data lines DL are formed thereon. The data line DL is connected to the source/drain regions 59 of the WL1 through a contact hole formed in the insulating film 61. FIG. 41(b) is a cross-sectional view cut along the line B—B in FIG. 38 in this stage. For every active region, i.e., for every block, a data line DL is provided. The wire ML is connected to the gate electrodes G through contact holes and further to wires in upper layers.

Figure 42:
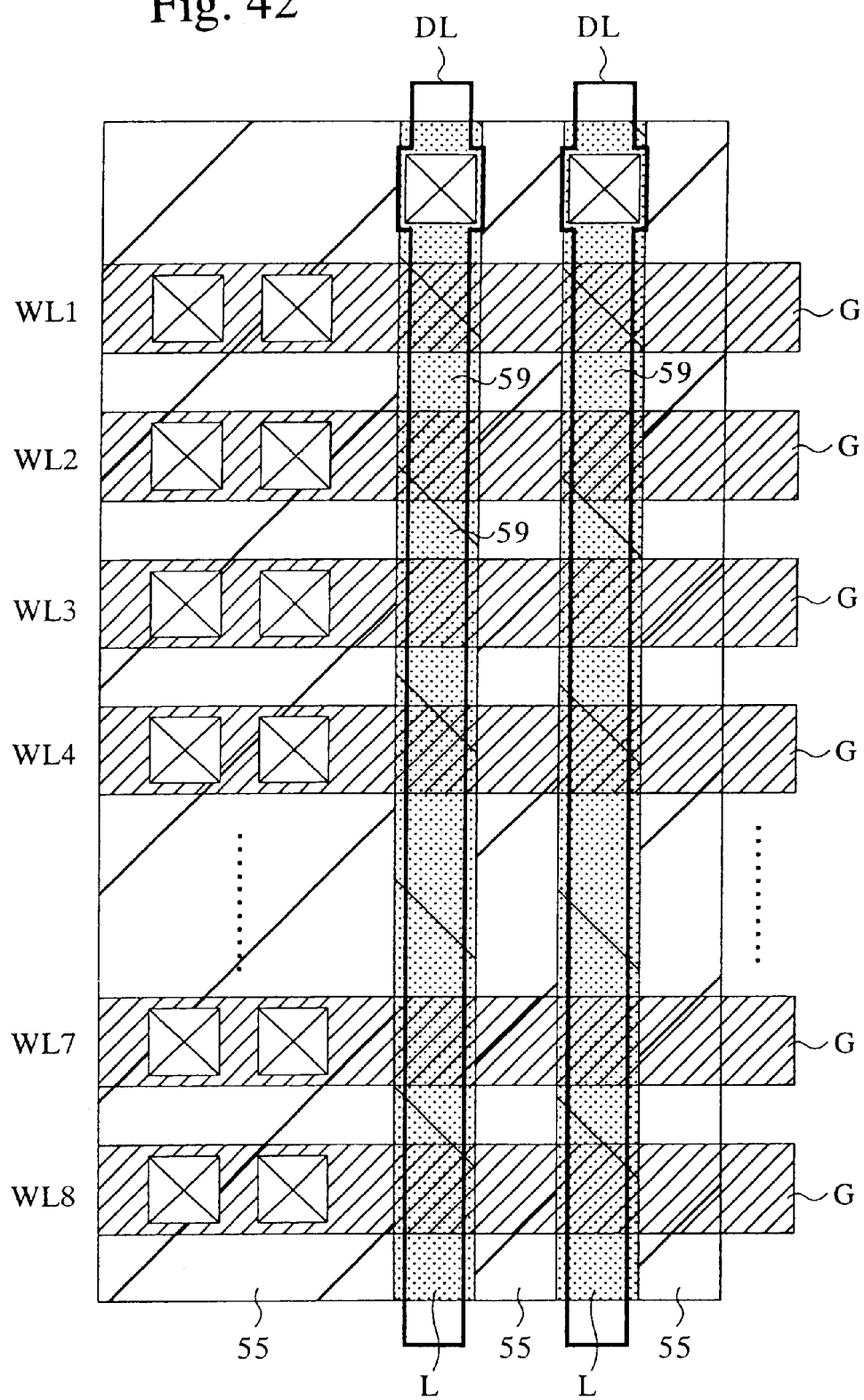
FIG. 42 is a plan view showing the method of manufacturing the NAND-type mask ROM according to the embodiment 2 in the order of its steps.

FIG. 42 is a plan view showing a flat layout in this stage. The gate electrodes G are formed at right angles to the active regions L. MISFETs are respectively connected in series by the source drain regions 59 formed between the gate electrodes G. The data lines DL are formed substantially above the active regions L, such that one data line DL is arranged for every active region L (or block).

Although metal wires can be formed in much upper layers in the same manner as described in the embodiment 1, explanation thereof will be omitted herefrom.

According to the present embodiment, it is possible to reduce dislocation defects caused in stripe-like active regions L like the embodiment 1. In this manner, junction leakages between mask ROMs can be prevented, so that the yield of elements and the reliability can be improved.

(Embodiment 3)

Figure 43:
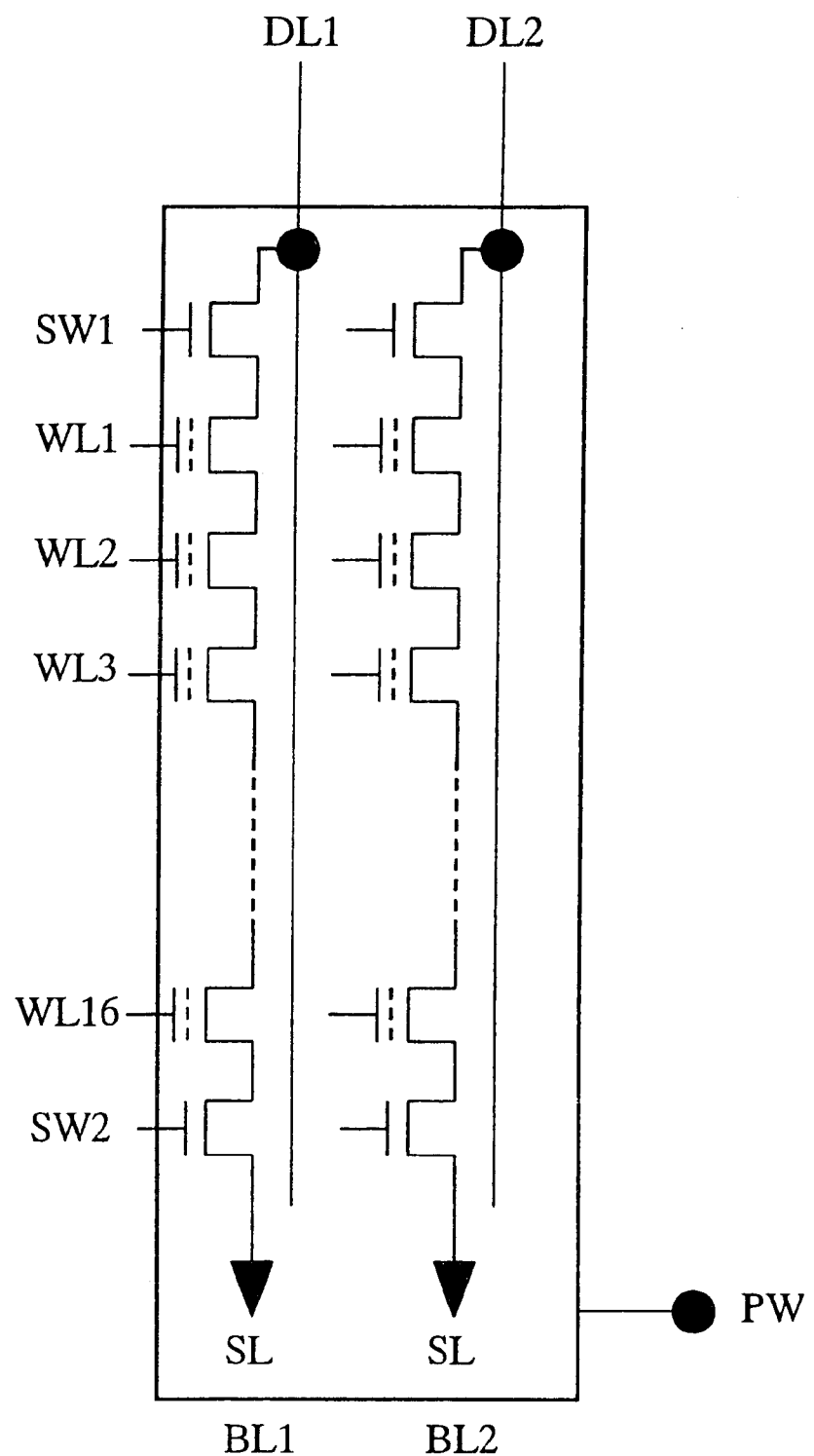
FIG. 43 is an equivalent circuit diagram showing an example of a NAND-type flash memory as further another embodiment (embodiment 3) of the present invention.

FIG. 43 is an equivalent circuit diagram showing an example of a NAND-type flash memory according to further another embodiment of the present invention. One block is constructed by connecting 16 memory cells in series and by switch transistors SW at two ends of the block. One (SW1) of the switch transistors is connected to a data line DL and the other (SW2) of the switch transistors is connected to a source line SL. One data line DL is provided for every block. Each block is provided in a p-type well PW so that a well potential can be applied thereto. Control gates of the memory cells are respectively connected to memory cells of an adjacent block, thereby forming word lines WL.

FIG. 44 is a table showing voltage conditions for reading, writing, and erasure of the NAND-type flash memory according to the present embodiment. The table shows a case where the word line WL2 is selected.

For reading, all the other word lines WL than the selected word line WL2 are set to a high voltage (VGH), to turn on the transistors. The switch transistors SW1 and SW2 are turned on so that the data lines DL and source lines SL are applied with a voltage. Further, with the data line DL1 and the source lines SL respectively applied with Vcc and 0 V, the selected word line WL2 is set to 0 V, and it is detected whether a corresponding memory cell is turned on or off. The on state or the off state corresponds to information of 1 bit.

For writing, the data line DL1, the source lines SL, and the PW are all set to 0 V, and the switch transistors SW1 and SW2 are respectively turned on and off. Writing is carried out by applying such a high voltage (Vp1) that passes through an oxide film to the word line WL2 selected for writing, thereby to inject electrons. The other word lines WL are not selected for writing and are therefore applied with a voltage (Vp2) enough to turn on transistors so that writing might not be performed. To inhibit writing into memory cells connected to other word lines WL2 in other blocks (BL2 and the like), the data lines (DL2 and the like) of non-selected blocks are applied with a voltage Vdp (Vdp<Vp2), and the potential difference between the channels and the control gates is lowered thereby to inhibit writing.

Erasure is carried out in units of blocks. The data lines and source lines are all opened. The switch transistors SW are all turned on, too. All the word lines WL are set to 0 V. A high voltage (Ve) is applied to the wells thereby to draw electrons from the floating gates of all memory cells. Thus, erasure is performed.

FIGS. 45 to 53 are plan views and cross-sectional views showing the method of manufacturing the NAND flash memory according to the present embodiment in the order of its steps.

Figure 45:
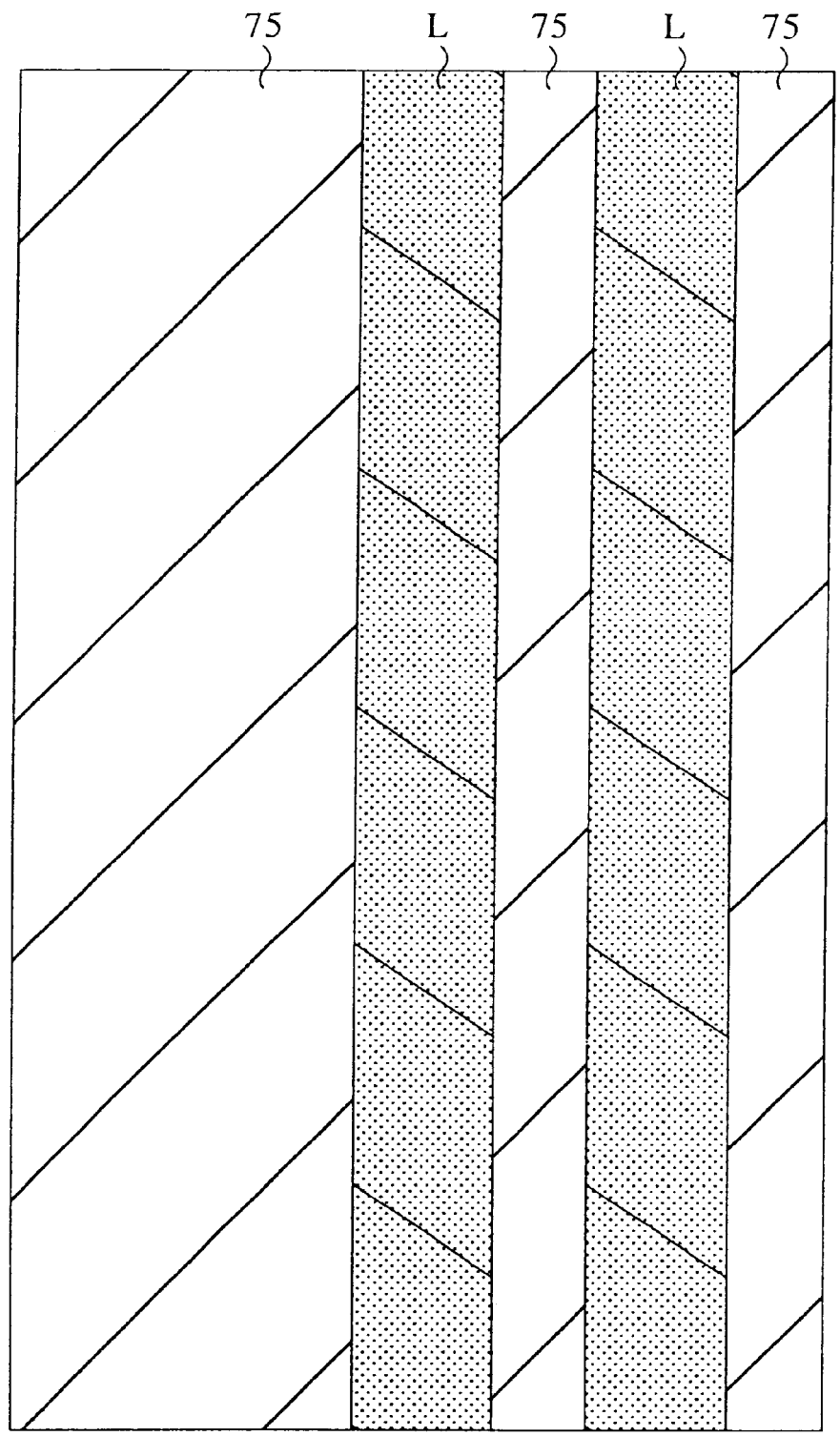
FIG. 45 is a plan view showing the method of manufacturing the NAND-type flash memory according to the embodiment 3 in the order of its steps.

In the manufacturing method according to the present embodiment, element separation regions 75 are formed on the main surface of a semiconductor substrate 71 having an epitaxial layer 72, like the embodiment 1. As shown in FIG. 45, the element separation regions 75 according to the present embodiment are also formed like stripes, like the embodiment 1. The semiconductor substrate 71 is the same as that of the embodiment 1. That is, the present embodiment also uses a silicon monocrystal substrate to which nitrogen or carbon is introduced. Therefore, since the present embodiment also uses a semiconductor substrate 71 which includes stripe-like active regions L and introduces nitrogen or carbon, it is possible to restrict defects such as junction leakages and the like which are caused by dislocation defects.

Figure 46:
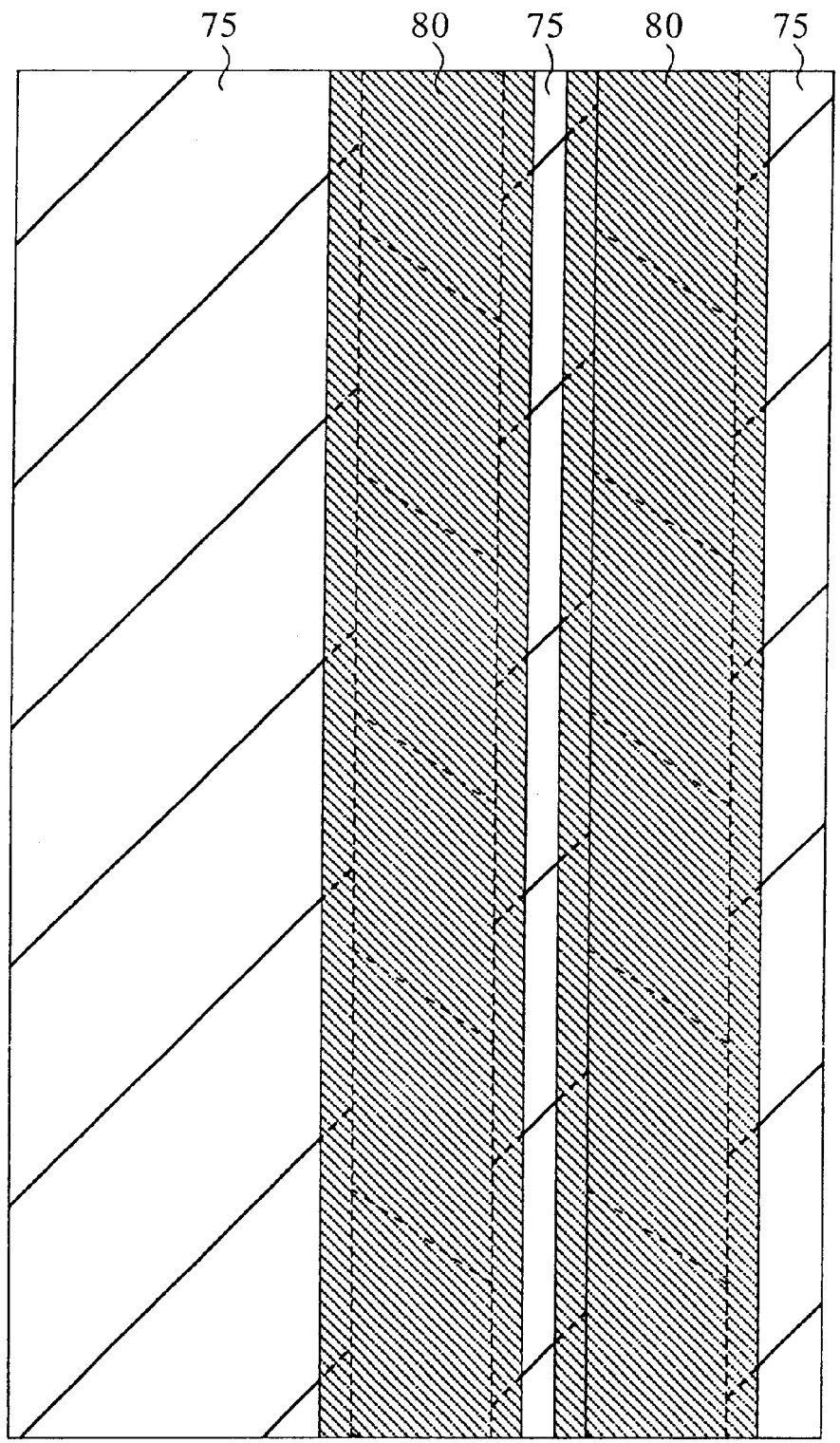
FIG. 46 is a plan view showing the method of manufacturing the NAND-type flash memory according to the embodiment 3 in the order of its steps.
Figure 47:
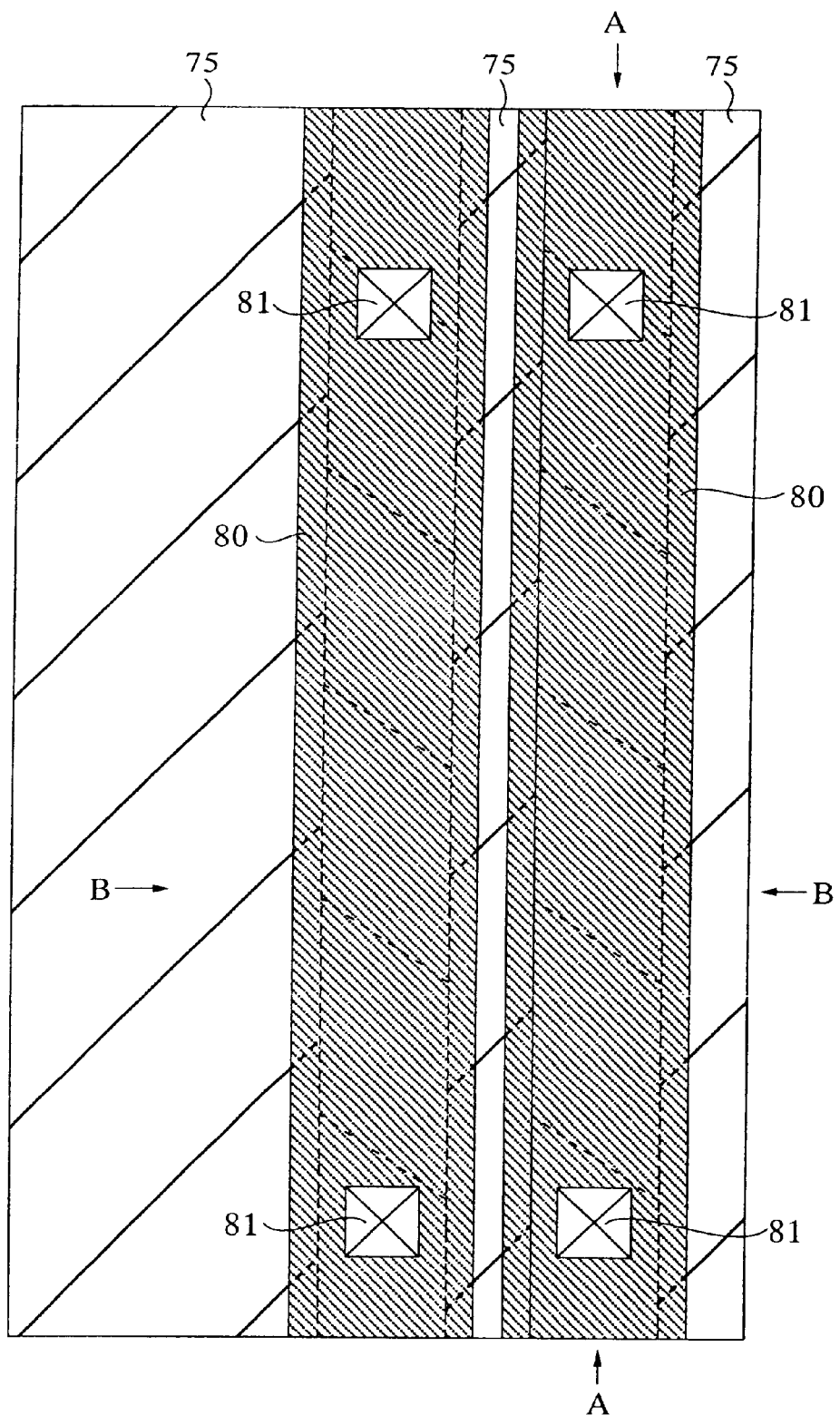
FIG. 47 is a plan view showing the method of manufacturing the NAND-type flash memory according to the embodiment 3 in the order of its steps.

Next, as shown in FIG. 46, patterns 80 to form floating gates are formed. The patterns 80 are formed so as to cover active regions L and overlap partially element separation regions 75. The patterns 80 are formed by etching a polycrystal silicon film deposited with a gate insulating film 76 inserted thereunder. Next, an interlayer insulating film 79 is formed on the patterns 80. Thereafter, as shown in FIG. 47, openings 81 are formed at parts of the interlayer insulating film 79.

Figure 48A:
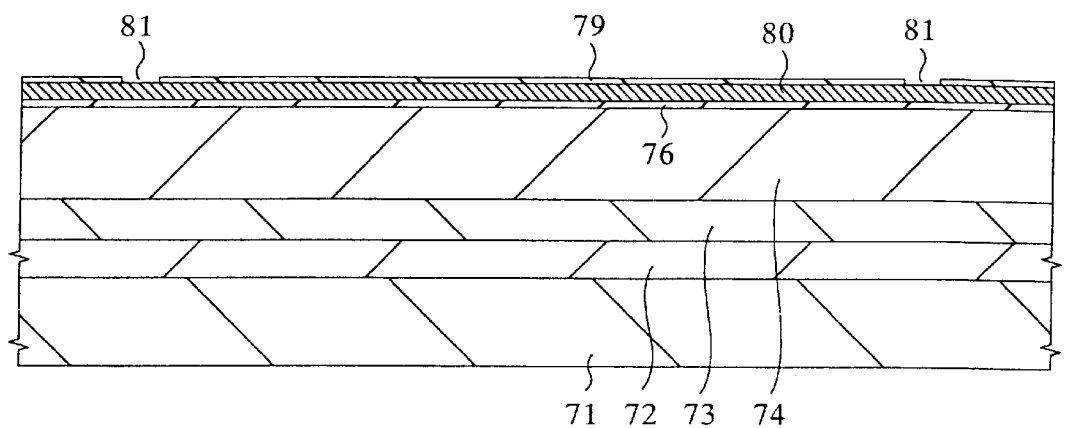
FIG. 48(a) is a cross-sectional view cut along the line A—A in FIG. 47
Figure 48B:
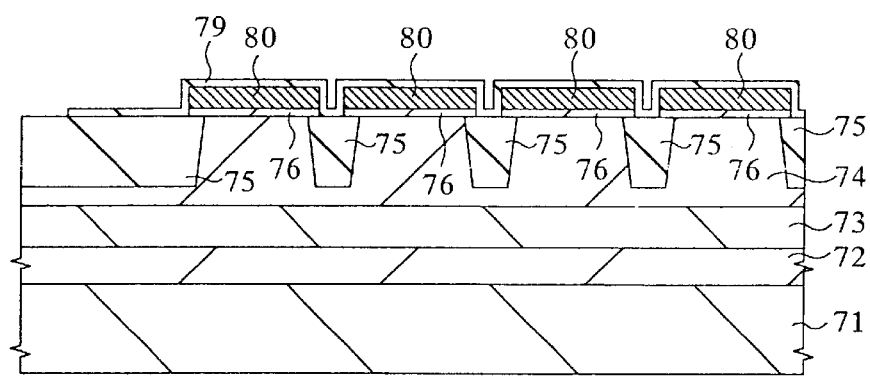
FIG. 48(b) is a cross sectional view cut along the line B—B in FIG. 47, showing the method of manufacturing the NAND-type flash memory according to the embodiment 3 in the order of its steps.

FIGS. 48(a) and 48(b) show cross-sectional views in this stage. FIG. 48(a) is a cross-sectional view cut along the line A—A in FIG. 47. FIG. 48(b) is a cross-sectional view cut along the line B—B in FIG. 47. The semiconductor substrate 71, an epitaxial layer 72, an n-type well 73, a p-type well 74, and element separation regions 75 are the same as those in the embodiment 1. As described before, patterns 80 made of a polycrystal silicon film are formed on the p-type well 74, with the gate insulating film 76 inserted thereunder. An interlayer insulating film 79 is formed on the pattern 80. Further, openings 81 are formed in the interlayer insulating film 79.

Figure 49:
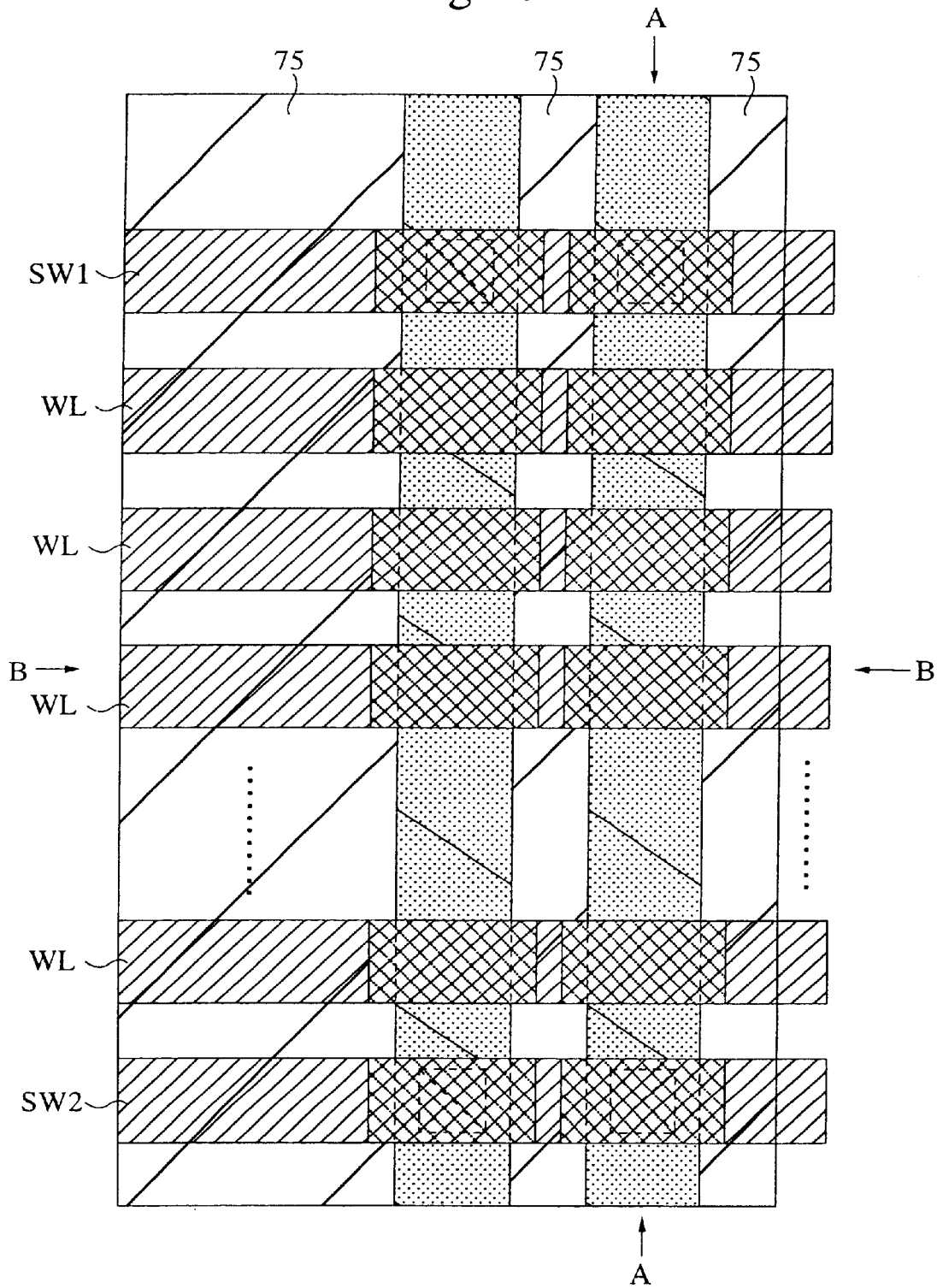
FIG. 49 is a plan view showing the method of manufacturing the NAND-type flash memory, according to the embodiment 3 in the order of its steps.

Next, a polycrystal silicon film and a tungsten silicide film are formed on the interlayer insulating film 79. As shown in FIG. 49, these films are subjected to patterning, to form word lines WL (control gates) and gate electrodes of switch transistors SW1 and SW2. Floating gates are formed below the word lines in the memory cells. Also, the gate electrodes of the switch transistors SW1 and SW2 are connected through the openings 81 to the floating gates provided below the transistors.

Figure 50:
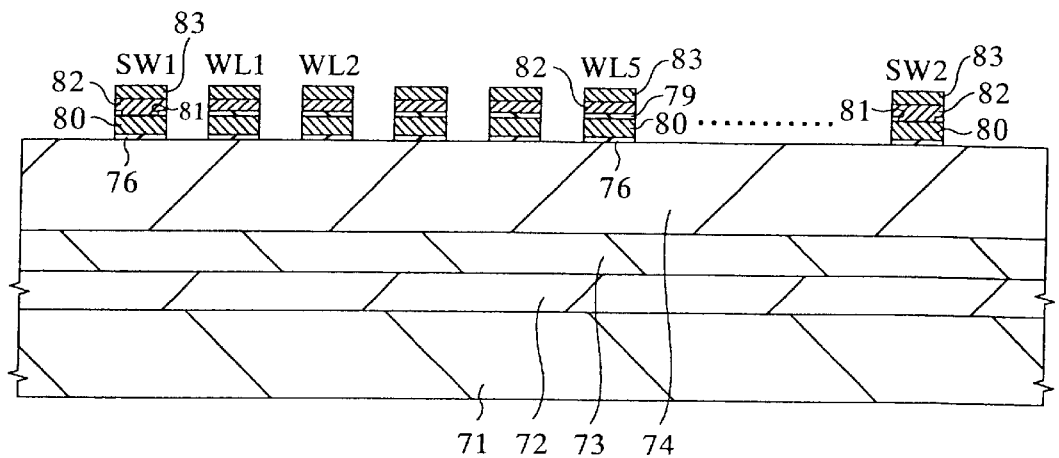
FIG. 50 is a cross-sectional view showing the method of manufacturing the NAND-type flash memory according to the embodiment 3 in the order of its steps.

FIG. 50 sows a cross-sectional view in this stage. FIG. 50 shows a cross-sectional view cut along the line A—A in FIG. 49. As previously described, a polycrystal silicon film 82 is formed on the interlayer insulating film 79, and a tungsten silicide film 83 is formed on the polycrystal silicon film 82. Also, the patterns 80 and the polycrystal silicon film 82 are electrically connected to each other through the openings 81, at the parts of the gate electrodes that form switch transistors SW. Therefore, switch transistors SW do not have floating gates but function as normal MISFETs.

Figure 51:
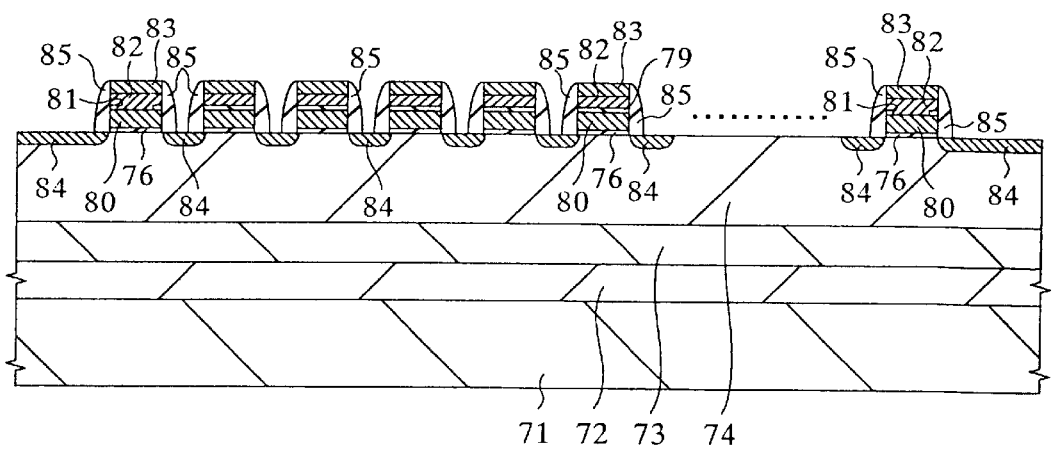
FIG. 51 is a cross-sectional view showing the method of manufacturing the NAND-type flash memory according to the embodiment 3 in the order of its steps.

Next, as shown in FIG. 51, ion-implantation is performed with the patterns of the word lines (control gates) used as a mask, thereby to form source/drain regions 84. Adjacent memory cells and switch transistors SW in the direction vertical to the word lines WL are connected in series by these source/drain regions 84. Further, side wall spacers 85 are formed on the side walls of the word line patterns.

Figure 52A:
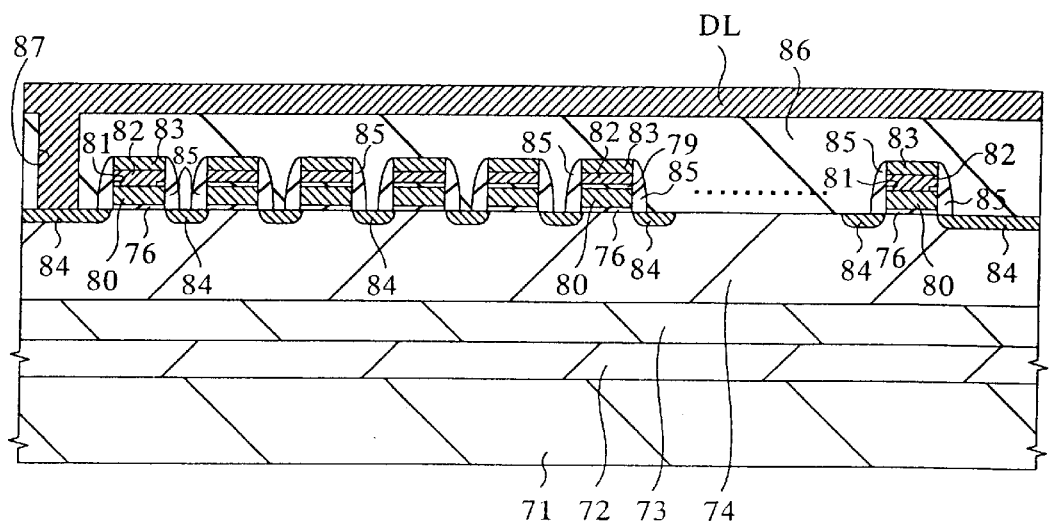
FIG. 52(a) is a cross-sectional view showing the method of manufacturing the NAND-type flash memory according to the embodiment 3 in the order of its steps.
Figure 52B:
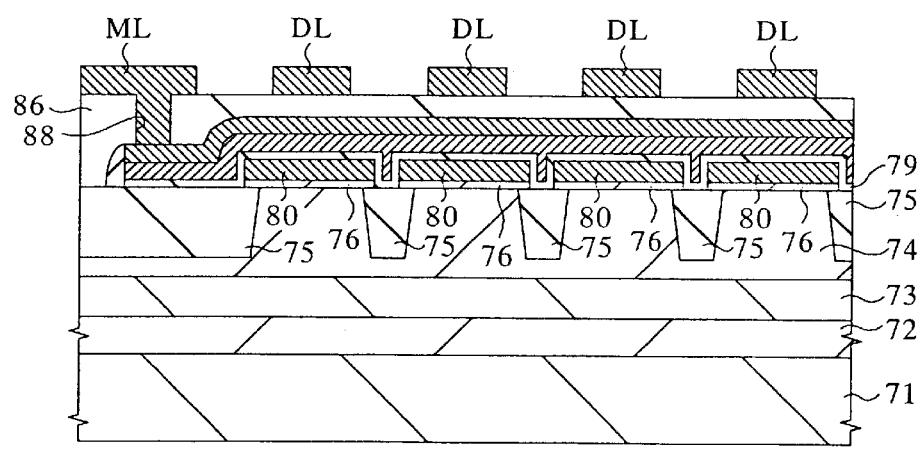
FIG. 52(b) is a cross-sectional view cut along the line B—B in FIG. 49.

Next, as shown in FIGS. 52, an insulating film 86 is formed, and data lines DL are formed as an upper layer thereon. The data lines DL are connected to the source/drain regions 84 of the SW1 through contact holes 87 opened in the insulating film 86. FIG. 52(b) is a cross-sectional view cut along the line B—B in FIG. 49 in this stage. For every active region, i.e., for every block, one data line DL is provided. Note that a wire ML is connected to the word lines WL through a contact hole 88 and is further connected to wires in much upper layers.

Figure 53:
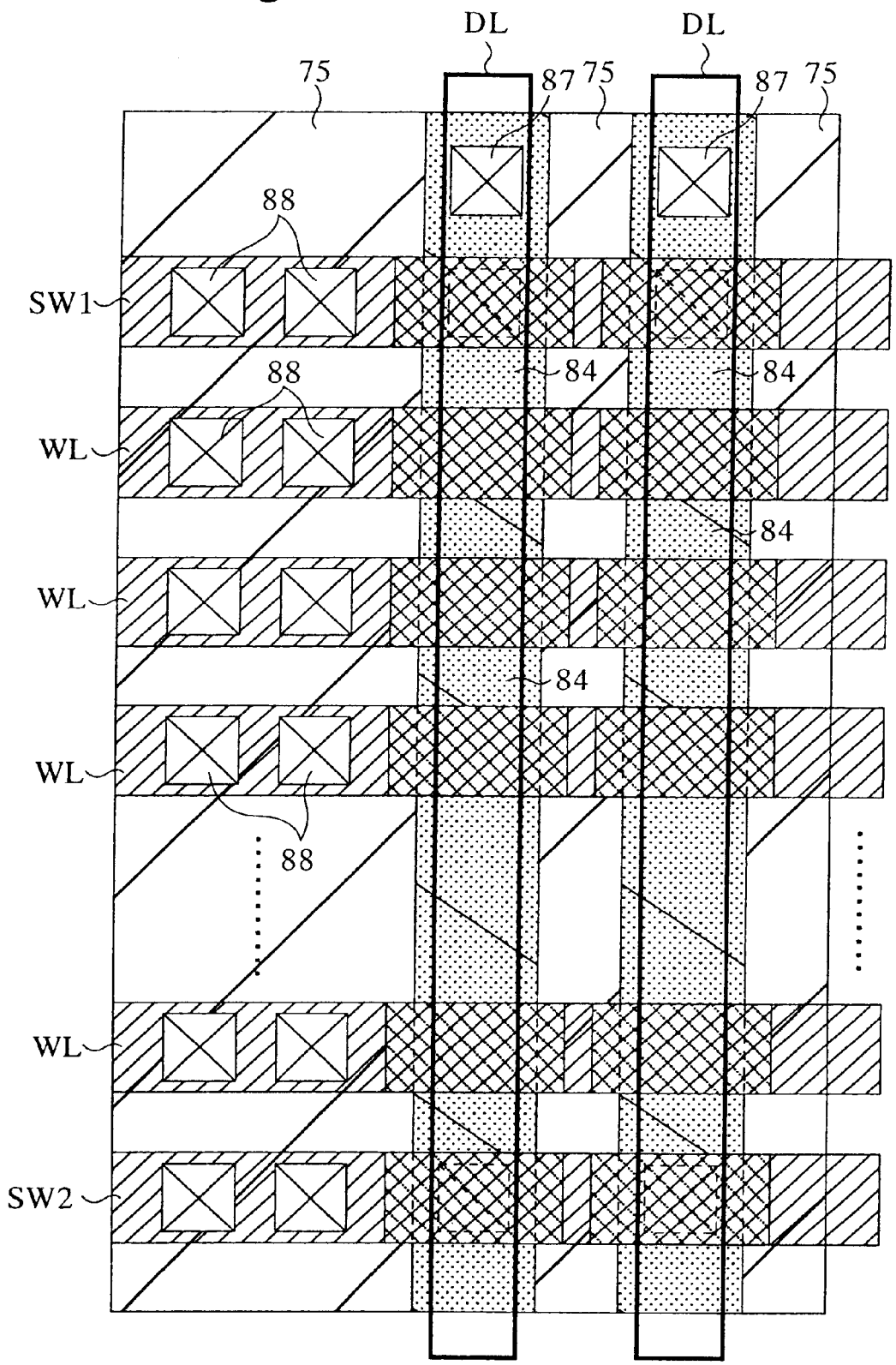
FIG. 53 is a plan view showing the method of manufacturing the NAND-type flash memory according to the embodiment 3 in the order of its steps.
Figure 54A:
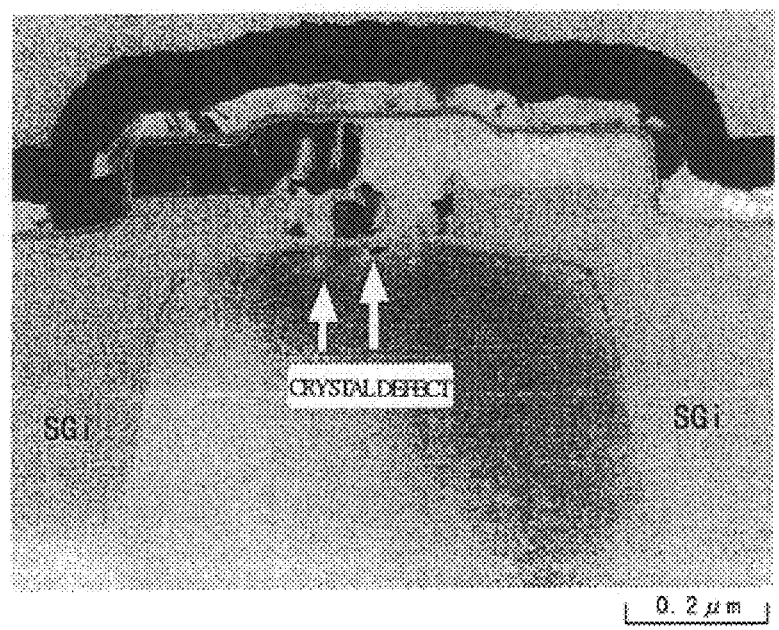
FIG. 54(a) is a TEM photograph observing an active region (channel part) at a portion which causes a defect.
Figure 54B:
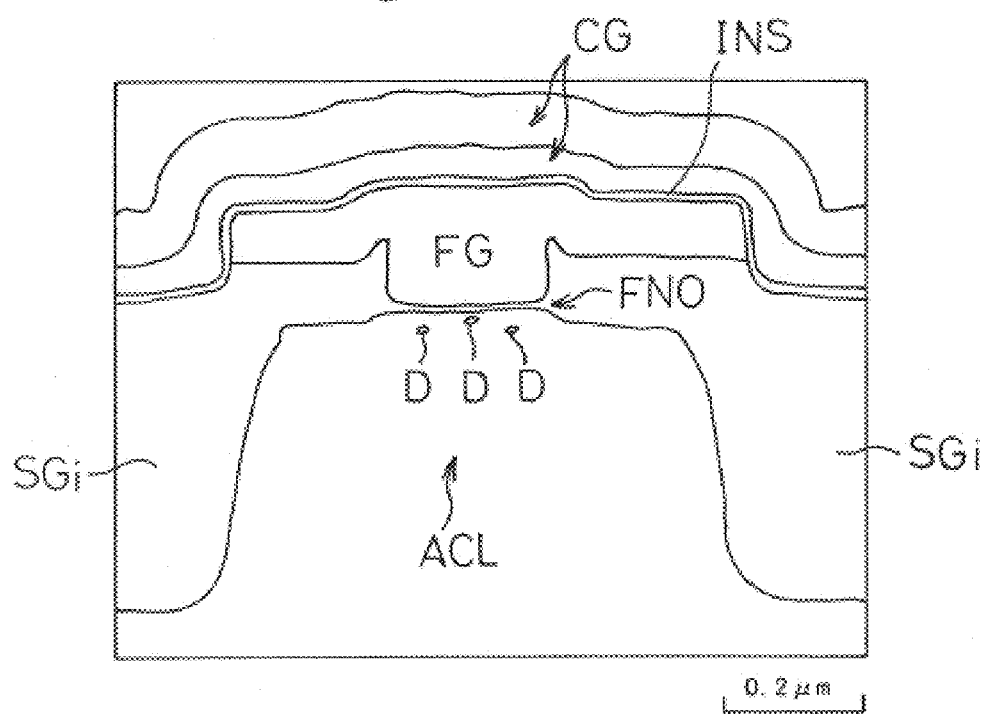
FIG. 54(b) is a schematic view obtained by tracing the photograph.

FIG. 53 is a plan view showing a flat layout in this stage. The word lines WL are formed at right angles to the active regions L. Memory cells are connected in series with each other by the source/drain regions 84 formed between adjacent memory cells in the direction vertical to the word lines. The data lines DL are formed substantially above the active regions L, such that one data line DL is provided for every active region L (for every block).

Metal wires may be formed in much upper layers. However, since those wires are the same as those in the embodiment 1, explanation thereof will be omitted herefrom.

According to the present embodiment, it is possible to reduce dislocation defects which occur in the stripe-like active regions L, like the embodiment 1. As a result, junction leakages of the NAND-type flash memory can be prevented, so the yield and reliability of elements can be improved.

In the above, inventions made by the present inventors have been specifically explained on the basis of the embodiments of the inventions. However, the present invention is not limited to the embodiments described above but may be variously modified without deviating from the scope of the invention.

For example, explanation has been made with respect to AND-type and NAND-type flash memories and a NAND-type mask ROM in the above embodiments. However, the present invention is not limited hitherto but is applicable to any elements that include stripe-like active regions.

Also, the embodiments described above have cited the directions [011] and [011] as examples. However, the directions are not limited hitherto but the present invention is applicable to any directions in which silicon crystal tends to cleave easily, as log as silicon crystal cleaves in those directions.

Although the above embodiments have been explained with respect to cases where nitrogen or carbon is introduced as impurities into the semiconductor substrate. However, the present invention is not limited hitherto but is applicable to any elements that have a smaller mass number than silicon, e.g., boron.

Representative ones of the inventions disclosed in the present application provide advantages as will be explained in brief below.

It is possible to reduce crystal defects (dislocation defects) in a non-volatile memory in which stripe-like element separation regions are formed to improve integration.

It is possible to reduce junction leakages in a non-volatile memory in which stripe-like element separation regions are formed to improve integration.

It is possible to improve the reliability and yield of a non-volatile memory in which stripe-like element separation regions are formed to improve integration.

What is claimed is:

1. A semiconductor integrated circuit device comprising:
   stripe-like grooves formed in a semiconductor substrate;
   insulating films embedded in said grooves and constructing element separations regions;
   a conductive film serving as a gate electrode of an MIS-type element, and formed on a main surface of said semiconductor substrate; and
   semiconductive regions formed in self alignment with said conductor film in a stripe-like active region formed between said element separation regions, and serving as source/drain regions of said MIS-type element,
   wherein a silicon substrate into which a light element having a smaller mass number than silicon is introduced is used as said semiconductor substrate,
   said light element is nitrogen or carbon, and
   said plurality of MIS-type elements are formed in said stripe-like active region.

2. The semiconductor integrated circuit device according to claim 1, wherein said stripe-like active region has a longer edge which is 100 or more times longer than a shorter edge.

3. The semiconductor integrated circuit device according to claim 2, wherein a substrate in which a silicon layer is grown within a range of 1 to 5 $\mu$m by epitaxial growth on a silicon substrate into which a light element having a smaller mass number than silicon is introduce is used as said semiconductor substrate.

4. The semiconductor integrated circuit device according to claim 2, wherein a concentration of said nitrogen ranges from $1\times10^{13}$ to $1\times10^{15}$ atomics/cm$^3$ and a concentration of said carbon ranges from $1\times10^{16}$ to $1\times10^{17}$ atomics/cm$^3$.

5. The semiconductor integrated circuit de ice according to claim 3, wherein a concentration of said nitrogen ranges from $1\times10^{13}$ to $1\times10^{15}$ atomics/cm$^3$ and a concentration of said carbon ranges from $1\times10^{16}$ to $1\times10^{17}$ atomics/cm$^3$.

6. The semiconductor integrated circuit device according to claim 1, wherein a substrate in which a silicon layer is grown within a range of 1 to 5 $\mu$m by epitaxial growth on a silicon substrate into which a light element having a smaller mass number than silicon is introduced is used as said semiconductor substrate.

7. The semiconductor integrated circuit device according to claim 6, wherein a concentration of said nitrogen ranges from $1\times10^{13}$ to $1\times10^{15}$ atomics/cm$^3$ and a concentration of said carbon ranges from $1\times10^{16}$ to $1\times10^{17}$ atomics/cm$^3$.

8. The semiconductor integrated circuit device according to claim 1, wherein a concentration of said nitrogen ranges from $1\times10^{13}$ to $1\times10^{15}$ atomics/cm$^3$ and a concentration of said carbon ranges from $1\times10^{16}$ to $1\times10^{17}$ atomics/cm$^3$.

9. The semiconductor integrated circuit device comprising:
   stripe-like grooves formed in a semiconductor substrate;
   insulating films embedded in said grooves and constituting element separation regions;
   a conductive film serving as a gate electrode of an MIS-type element, and formed on a main surface of said semiconductor substrate; and
   semiconductor regions formed in self alignment with said conductor film in a stripe-like active region formed between said element separation regions, and serving as source/drain regions of said MIS-type element,
   wherein a silicon substrate into which a light element having a smaller mass number than silicon is introduced is used as said semiconductor substrate,
   wherein said light element is nitrogen or carbon, and
   wherein said stripe-like active region has a longer edge which is 100 or more times longer than a shorter edge.

10. The semiconductor integrated circuit device according to claim 9, wherein a substrate in which a silicon layer is grown within a range of 1 to 5 $\mu$m by epitaxial growth on a silicon substrate into which a light element having a smaller mass than silicon is introduced is used as said semiconductor substrate.

11. The semiconductor integrated circuit device according to claim 10, wherein a concentration of nitrogen ranges from $1\times10^{13}$ to $1\times10^{15}$ atomics/cm$^3$ and a concentration of said carbon ranges from $1\times10^{16}$ to $1\times10^{17}$ atomics/cm$^3$.

12. The semiconductor integrated circuit device according to claim 9, wherein a concentration of said nitrogen ranges from $1\times10^{13}$ to $1\times10^{15}$ atomics/cm$^3$ and a concentration of said carbon ranges from $1\times10^{16}$ to $1\times10^{17}$ atomics/cm$^3$.

* * * * *